(12) United States Patent
Zhang et al.

(10) Patent No.: US 11,094,765 B2
(45) Date of Patent: Aug. 17, 2021

(54) ARRAY SUBSTRATE, MANUFACTURING METHOD THEREOF, AND DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Shun Zhang, Beijing (CN); Linhong Han, Beijing (CN); Yang Zhou, Beijing (CN); Mengmeng Du, Beijing (CN); Yue Teng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/713,977

(22) Filed: Dec. 13, 2019

(65) Prior Publication Data

US 2020/0266256 A1   Aug. 20, 2020

(30) Foreign Application Priority Data

Feb. 14, 2019   (CN) .......................... 201910114704.4

(51) Int. Cl.
*H01L 27/32* (2006.01)
*H01L 27/12* (2006.01)
(52) U.S. Cl.
CPC ...... *H01L 27/3262* (2013.01); *H01L 27/1251* (2013.01); *H01L 2227/323* (2013.01)

(58) Field of Classification Search
CPC ............. H01L 27/3262; H01L 27/1251; H01L 2227/323
See application file for complete search history.

(56) References Cited

U.S. PATENT DOCUMENTS

2015/0243685 A1   8/2015   Lee et al.
2018/0254351 A1*  9/2018   Jung ..................... H01L 27/281

FOREIGN PATENT DOCUMENTS

| CN | 204464282 U | 7/2015 |
| CN | 106206430 A | 12/2016 |
| CN | 108321159 A | 7/2018 |

OTHER PUBLICATIONS

1st Chinese Office Action, English Translation.
(Continued)

*Primary Examiner* — Marc Anthony Armand
(74) *Attorney, Agent, or Firm* — Brooks Kushman P.C.

(57) ABSTRACT

The present disclosure relates to an array substrate, manufacturing method thereof, and a display panel. The array substrate includes a substrate, at least a first top gate TFT and at least a first bottom gate TFT disposed on the substrate and located in each sub-pixel region; a gate of the first top gate TFT and a gate of the first bottom gate TFT are formed in a same layer with same material, an active layer pattern of the first top gate TFT and an active layer pattern of the first bottom gate TFT are respectively arranged on two sides of the gate, and orthographic projections of the active layer pattern of the first top gate TFT and the active layer pattern of the first bottom gate TFT on the substrate are spaced from each other in a first direction.

17 Claims, 24 Drawing Sheets

(56) References Cited

OTHER PUBLICATIONS

CN106206430A, English Abstract and Machine Translation.
CN108321159A, English Abstract and Machine Translation.
CN204464282U, English Abstract and U.S. Equivalent U.S. Pub. No. 2015/0243685.
First Office Action for Chinese Application No. 201910114704.4, dated Jul. 15, 2020, 6 Pages.

\* cited by examiner forming, through a single patterning process, an active layer pattern at the region of the first top gate TFT, the region of the second top gate TFT, the region of the third top gate TFT 10 and the region of the fifth top gate TFT on the substrate — S601 forming a gate insulating layer covering the substrate on which the active layer patterns of the first top gate TFT, the second top gate TFT, the third top gate TFT and the fifth top gate TFT have been formed — S602 forming, through a single patterning process, a gate of the first top gate TFT at the region of the first top gate TFT, a gate of the first bottom gate TFT at the region of the first bottom gate TFT, a gate of the second top gate TFT at the region of the second top gate TFT, a gate of the third top gate TFT at the region of the third top gate TFT, a gate of the fifth top gate TFT at the region of the fifth top gate TFT, and a gate of the third bottom gate TFT at the region of the third bottom gate TFT, on the substrate on which the gate insulating layer has been formed — S603 forming a gate insulating layer covering the substrate on which the gate of the first top gate TFT, the gate of the second top gate TFT, the gate of the third top gate TFT, the gate of the fifth top gate TFT, the gate of the first bottom gate TFT and the gate of the third bottom gate TFT have been formed — S604 forming, through a single patterning process, an active layer pattern at the region of the first bottom gate TFT and the region of the third bottom gate TFT on the substrate on which the gate insulating layer has been formed — S605 forming a source S and a drain D respectively at the region of the first top gate TFT, the region of the second top gate TFT, the region of the third top gate TFT and the region of the fifth top gate TFT, the regions of the first bottom gate TFT and the third bottom gate TFT — S606

Fig. 19

ARRAY SUBSTRATE, MANUFACTURING METHOD THEREOF, AND DISPLAY PANEL

CROSS-REFERENCE TO RELATED APPLICATION

This application claims priority to Chinese Patent Application No. 201910114704.4 filed on Feb. 14, 2019, which is incorporated herein by reference in its entirety.

TECHNICAL FIELD

The present disclosure relates to the field of display technology, in particular to an array substrate and a display panel.

BACKGROUND

Organic light emitting diode (OLED) display device has attracted much attention because of its simple fabrication process, low cost, low power consumption, high luminance, wide operation temperature range, fast response, high contrast, flexibility and wide viewing angle.

According to the driving mode, OLED can be divided into two categories: Passive Matrix OLED (PMOLED) and Active Matrix OLED (AMOLED), namely direct addressing and thin film transistor (TFT) matrix addressing. AMOLED has pixels arranged in array and has an active display mode, which produces high luminous efficiency, and is usually used as a large-size display device with high definition.

As the requirement of resolution is increasing, the demand for improving pixel density (Pixels Per Inch, PPI) is getting higher and higher. A higher PPI means a smaller sub-pixel area, and the smaller the effective layout area of the circuit when the process capability remains the same. Especially for the AMOLED display panel, there are usually 2-7 TFTs in a sub-pixel, which puts forward higher requirements for the circuit layout.

SUMMARY

According to some embodiments of the present disclosure, an array substrate is provided, which includes a substrate, at least one top gate TFT and at least one bottom gate TFT disposed on the substrate and located in each sub-pixel region; the at least one top gate TFT includes a first top gate TFT, the at least one bottom gate TFT includes a first bottom gate TFT, a gate of the first top gate TFT and a gate of the first bottom gate TFT are formed in a same layer with same material, an active layer pattern of the first top gate TFT and an active layer pattern of the first bottom gate TFT are respectively arranged on two sides of the gate, and orthographic projections of the active layer pattern of the first top gate TFT and the active layer pattern of the first bottom gate TFT on the substrate are spaced from each other in a first direction.

Optionally, both the active layer pattern of the at least one top gate TFT and the active layer pattern of the at least one bottom gate TFT extend in a second direction, the first direction and the second direction cross each other.

Optionally, the at least one top gate TFT further includes a second top gate TFT, the first bottom gate TFT is located between the first top gate TFT and the second top gate TFT; the active layer pattern of the first top gate TFT and the active layer pattern of the second top gate TFT are formed in a same layer with same material, the gate of the first top gate TFT, the gate of the first bottom gate TFT and the gate of the second top gate TFT are formed in a same layer with same material; and orthographic projections of the active layer pattern of the first top gate TFT, the active layer pattern of the first bottom gate TFT and the active layer pattern of the second top gate TFT on the substrate are spaced from each other in a the first direction.

Optionally, the at least one bottom gate TFT further includes a second bottom gate TFT, the first top gate TFT is located between the first bottom gate TFT and the second bottom gate TFT; the active layer pattern of the first bottom gate TFT and the active layer pattern of the second bottom gate TFT are formed in a same layer with same material, the gate of the first bottom gate TFT, the gate of the first top gate TFT and the gate of the second bottom gate TFT are formed in a same layer with same material; and orthographic projections of the active layer pattern of the first bottom gate TFT, the active layer pattern of the first top gate TFT and the active layer pattern of the second bottom gate TFT on the substrate are spaced from each other in a the first direction.

Optionally, the array substrate further includes a first gate line, the gate of the first top gate TFT, the gate of the first bottom gate TFT and the gate of the second top gate TFT are respectively part of the first gate line.

Optionally, the array substrate further includes a first gate line, the gate of the first bottom gate TFT, the gate of the first top gate TFT and the gate of the second bottom gate TFT are respectively part of the first gate line.

Optionally, the at least one top gate TFT further includes a third top gate TFT, the active layer pattern of the first top gate TFT and the active layer pattern of the third top gate TFT are formed in a same layer and connected with each other, and the active layer pattern of the third top gate TFT extends in the second direction.

On the basis of above, optionally, the at least one bottom gate TFT further includes a third bottom gate TFT, the active layer pattern of the first bottom gate TFT and the active layer pattern of the third bottom gate TFT are formed in a same layer and connected with each other, and the active layer pattern of the third bottom gate TFT extends in the second direction.

Optionally, the at least one bottom gate TFT further includes a fourth bottom gate TFT, the active layer pattern of the first top gate TFT and the active layer pattern of the fourth bottom gate TFT are formed in different layers, and the active layer pattern of the fourth bottom gate TFT extends in the second direction.

Optionally, the at least one top gate TFT further includes a fourth top gate TFT, the active layer pattern of the first bottom gate TFT and the active layer pattern of the fourth top gate TFT are formed in different layers, and the active layer pattern of the fourth top gate TFT extends in the second direction.

Optionally, in the case that the at least one top gate TFT includes the second top gate TFT, the at least one top gate TFT further includes a fifth top gate TFT, the active layer pattern of the second top gate TFT and the active layer pattern of the fifth top gate TFT are formed in a same layer and connected with each other, and the active layer pattern of the fifth top gate TFT extends in the second direction; or, in the case that the at least one bottom gate TFT includes the second bottom gate TFT, the at least one bottom gate TFT further includes a fifth bottom gate TFT, the active layer pattern of the second bottom gate TFT and the active layer pattern of the fifth bottom gate TFT are formed in a same layer and connected with each other, and the active layer pattern of the fifth bottom gate TFT extends in the second direction.

Optionally, in the case that the at least one top gate TFT includes the second top gate TFT, the at least one bottom gate TFT further includes a sixth bottom gate TFT, the active layer pattern of the second top gate TFT and the active layer pattern of the sixth bottom gate TFT are formed in different layers, and the active layer pattern of the sixth bottom gate TFT extends in the second direction; or, in the case that the at least one bottom gate TFT includes the second bottom gate TFT, the at least one top gate TFT further includes a sixth top gate TFT, the active layer pattern of the second bottom gate TFT and the active layer pattern of the sixth top gate TFT are formed in different layers, and the active layer pattern of the sixth top gate TFT extends in the second direction.

Optionally, the array substrate further includes a second gate line, the gate of the third top gate TFT, the gate of the third bottom gate TFT and the gate of the fifth top gate TFT are respectively part of the second gate line; or, the gate of the third top gate TFT, the gate of the third bottom gate TFT and the gate of the fifth bottom gate TFT are respectively part of the second gate line.

Optionally, the array substrate further includes a second gate line, the gate of the fourth bottom gate TFT, the gate of the fourth top gate TFT and the gate of the sixth bottom gate TFT are respectively part of the second gate line; or, the gate of the fourth bottom gate TFT, the gate of the fourth top gate TFT and the gate of the sixth top gate TFT are respectively part of the second gate line.

According to some embodiments of the present disclosure, a manufacturing method of an array substrate is provided, the array substrate comprises a substrate, at least one top gate TFT and at least one bottom gate TFT disposed on the substrate and located in each sub-pixel region, the method includes:

forming an active layer pattern of the first top gate TFT through a single patterning process;

forming a gate insulating layer covering the substrate on which an active layer pattern of the first top gate TFT has been formed;

forming, through a single patterning process, a gate of the first top gate TFT and a gate of the first bottom gate TFT on the substrate on which the gate insulating layer has been formed;

forming a gate insulating layer covering the substrate; and forming, through a single patterning process, an active layer pattern of the first bottom gate TFT on the substrate on which the gate insulating layer has been formed, wherein orthographic projections of the active layer pattern of the first top gate TFT and the active layer pattern of the first bottom gate TFT on the substrate are spaced from each other in a first direction.

According to some embodiments of the present disclosure, a display panel including the above array substrate is also provided.

BRIEF DESCRIPTION OF THE DRAWINGS

In order to clearly illustrate the technical solution in the embodiments or related art of the present disclosure, the accompany drawings will be briefly described below. It should be understood that, the drawings described below are merely some embodiments of the present disclosure, and for those skilled in the art, additional drawings can be obtained on the basis of these drawings without creative effort.

FIG. 1b is a cross-sectional diagram of FIG. 1a;

FIG. 3b is a cross-sectional diagram of FIG. 3a;

FIG. 4b is a cross-sectional diagram of FIG. 4a;

FIG. 10b is a cross-sectional diagram of FIG. 10a;

FIG. 11b is a cross-sectional diagram of FIG. 11a;

FIG. 19 is a schematic diagram of another manufacturing method of an array substrate provided in the present disclosure;

DETAILED DESCRIPTION

Hereinafter, a clear and comprehensive description to the embodiments of the present disclosure will be provided in conjunction with the drawings. It should be understood that the embodiment described herein is merely a part of the embodiments rather than all of them. Based upon the embodiments in the present disclosure, additional embodiments can be obtained by those skilled in the art without creative effort, and these embodiments should also fall within the protective scope of the present disclosure.

Figure 1A:
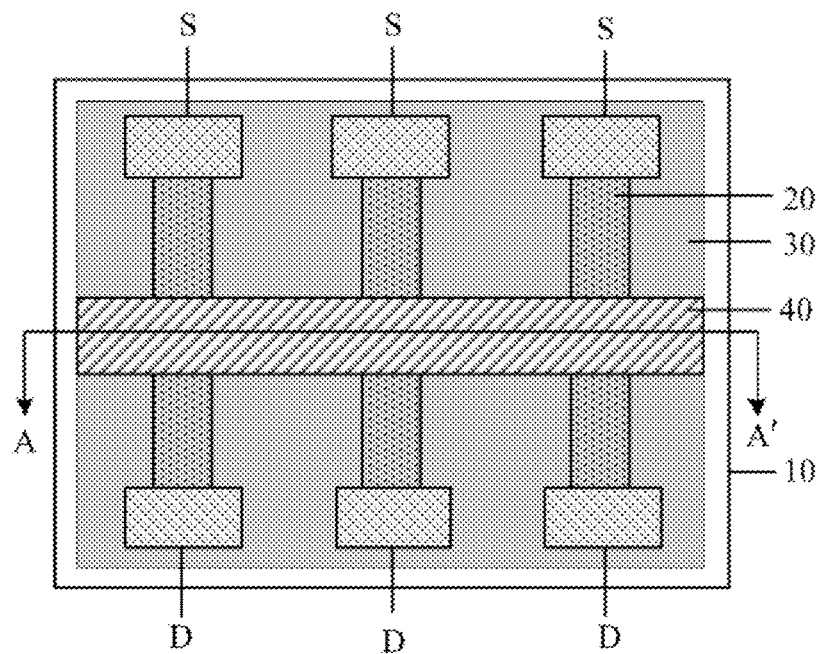
FIG. 1a is a schematic top view of an array substrate in the related art.
Figure 1B:
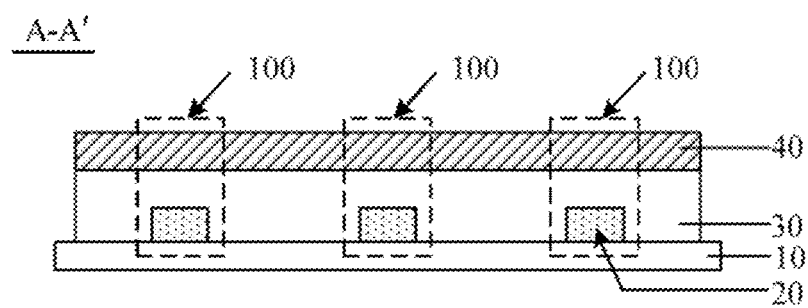

In order to drive light-emitting devices in the AMOLED to emit light, a drive circuit including a plurality of TFTs is provided in each sub-pixel area of the array substrate. In the related art, all of the TFTs in a same sub-pixel area may adopt top gate type or bottom gate type. Taking a plurality of top gate TFTs in the sub-pixel area as an example, as shown in FIGS. 1A and 1b, each top gate TFT includes an active layer pattern 20, a gate insulation layer 30, a gate 40, a source S and a drain D arranged in sequence on a substrate 10, wherein the plurality of top gate TFTs are arranged at intervals along the horizontal direction as shown in FIGS. 1A and 1b, and the length direction (extending direction) of the active layer pattern 20 in each top gate TFT crosses the horizontal direction. Since the active layer patterns 20 of adjacent top gate TFTs require certain space therebetween, the area of effective circuit layout cannot be reduced, thus the area of the sub-pixel area cannot be reduced.

Figure 2:
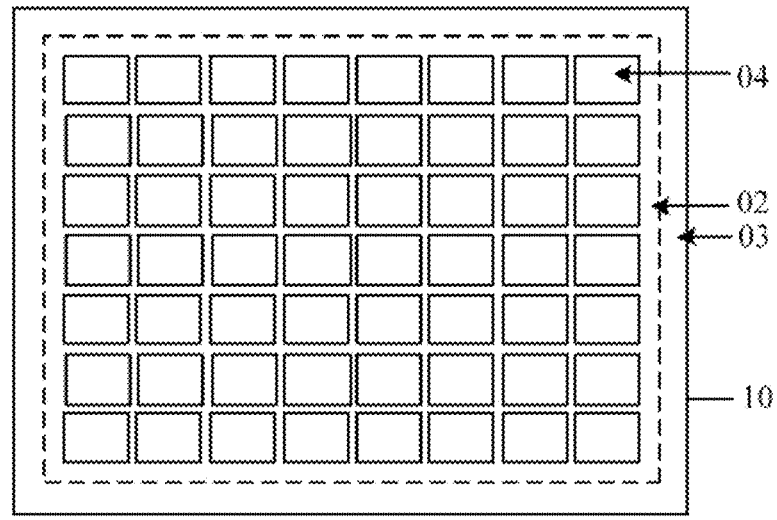
FIG. 2 is a schematic top view of an array substrate according to the present disclosure.
Figure 3A:
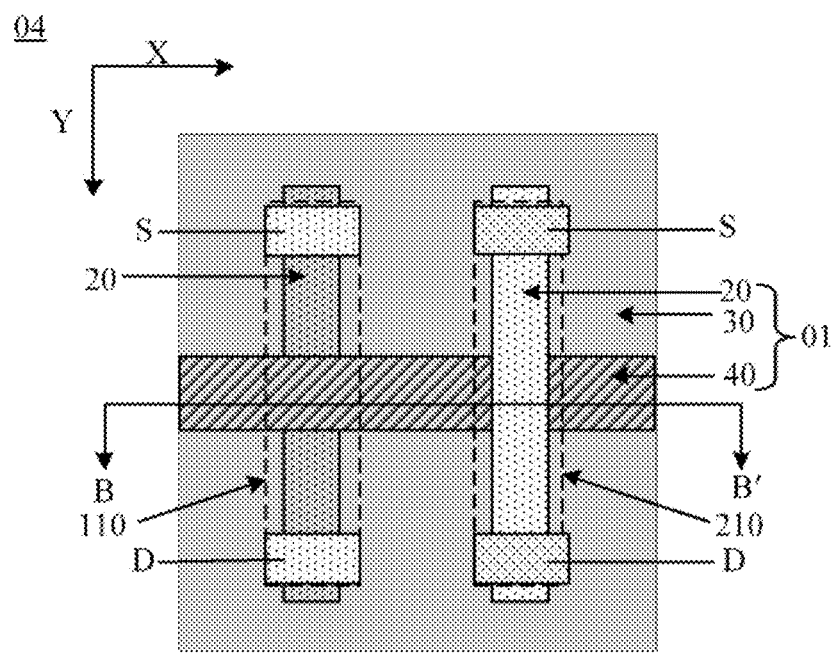
FIG. 3a is a schematic top view of another array substrate provided in the present disclosure.
Figure 3B:
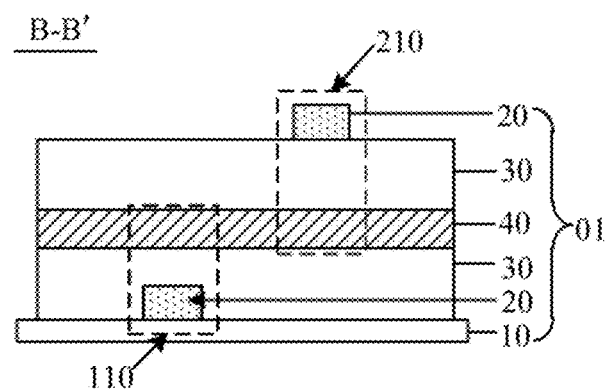

In view of above, an array substrate is provided according to some embodiment of the present disclosure, as shown in FIGS. 2, 3a and 3b, the array substrate 01 includes a substrate 10, at least one top gate TFT and at least one bottom gate TFT disposed on the substrate 10 and located in each sub-pixel region 04.

As shown in FIGS. 3a and 3b, the at least one top gate TFT includes a first top gate TFT 110, the at least one bottom gate TFT includes a first bottom gate TFT 210, an active layer pattern 20 of the first top gate TFT 110 and an active layer pattern 20 of the first bottom gate TFT 210 are respectively arranged along a first direction X and disposed on different layers. Both the active layer pattern 20 of the first top gate TFT 110 and the active layer pattern 20 of the first bottom gate TFT 210 extend in a second direction Y, the first direction X and the second direction Y cross each other.

As shown in FIG. 2, the array substrate 01 may be divided into a display area 02 and a peripheral area 03, the peripheral area 03 is arranged around the display area 02, and the display area 02 can be divided into a plurality of sub-pixel areas 04.

Both top-gate TFT and bottom-gate TFT include a gate, an active layer pattern 20, a source S and a drain D. For the top gate TFT, the gate is located on a side of the active layer pattern 20 away from the substrate 10, and for the bottom gate TFT, the gate is located on a side of the active layer pattern 20 close to the substrate 10. In other words, for the top gate TFT and the bottom gate TFT adjacent in each sub-pixel region, the gates of both are arranged in a same layer and made of the same material, and form part of the gate line of the array substrate 01, such that the active layer pattern 20 of the top gate TFT is located on a side of the gate close to the substrate 10, while the active layer pattern 20 of the bottom gate TFT is located on a side of the gate away from the substrate 10. The source S and the drain D can be placed according to the actual circuit design, which is not limited in this disclosure.

The active layer pattern 20 of the first top gate TFT 110 and the active layer pattern 20 of the first bottom gate TFT 210 are formed in different layers, that is, along the thickness direction of the array substrate, additional layer is disposed between the active layer pattern 20 of the first top gate TFT 110 and the active layer pattern 20 of the first bottom gate TFT 210. In other words, the active layer pattern 20 of the first top gate TFT 110 and the active layer pattern 20 of the first bottom gate TFT 210 do not overlap each other in a direction perpendicular to the display substrate.

During manufacturing, the active layer pattern 20 of the first top gate TFT 110 and the active layer pattern 20 of the first bottom gate TFT 210 can be formed respectively through two patterning process.

It should be noted that, although the embodiments of the present disclosure are exemplified as setting the first direction X and the second direction Y perpendicular to each other, the intersection angle between the first direction X and the second direction Y may be any angle according to practical requirements.

According to the embodiments of the present disclosure, an array substrate 01 is provided, in which at least a top gate TFT 110 and at least a bottom gate TFT 210 are provided in each sub-pixel region 04, and the active layer pattern 20 of the first top gate TFT 110 and the active layer pattern 20 of the first bottom gate TFT 210 are arranged in different layers, thereby layout of the first top gate TFT 110 and the first bottom gate TFT 210 is not restricted by the necessary spacing between the top gate TFTs arranged in the same layer or the bottom gate TFTs arranged in the same layer, as in the related art. Therefore the distance between the orthographic projections of the first top gate TFT 110 and the first bottom gate TFT 210 on the substrate can be reduced, the area occupied by the sub-pixel region 04 is also reduced, thereby a compact circuit layout can be implemented.

Figure 4A:
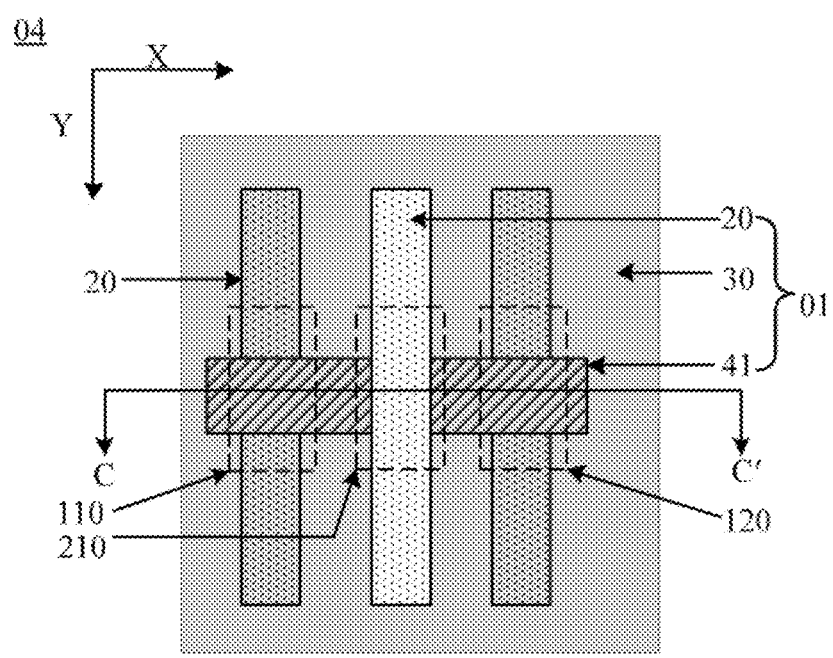
FIG. 4a is a schematic top view of another array substrate provided in the present disclosure.
Figure 4B:
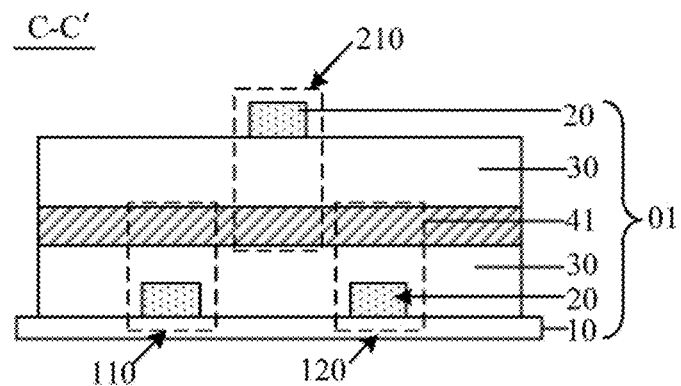

Optionally, as shown in FIGS. 4a and 4b, the at least one top gate TFT further includes a second top gate TFT 120, the first bottom gate TFT 210 is located between the first top gate TFT 110 and the second top gate TFT 120; the active layer pattern 20 of the first top gate TFT 110 and the active layer pattern 20 of the second top gate TFT 120 are formed in a same layer, the active layer pattern 20 of the second top gate TFT 120 extends in the second direction Y. The gate 40 of the first top gate TFT 110, the gate 40 of the first bottom gate TFT 210 and the gate 40 of the second top gate TFT 120 are arranged in the same layer and are made of same material.

The active layer pattern 20 of the first top gate TFT 110 and the active layer pattern 20 of the second top gate TFT 120 are arranged in the same layer and are made of same material, i.e. the active layer pattern 20 of the first top gate TFT 110 and the active layer pattern 20 of the second top gate TFT 120 can be formed through a single patterning process.

The gate 40 of the first top gate TFT 110, the gate 40 of the first bottom gate TFT 210 and the gate 40 of the second top gate TFT 120 are arranged in the same layer and are made of same material. That is, the gate 40 of the first top gate TFT 110, the gate 40 of the first bottom gate TFT 210 and the gate 40 of the second top gate TFT 120 can be formed through a single patterning process.

In the related art, certain space is needed between the active layer patterns of adjacent top gate TFTs or between the active layer patterns of adjacent bottom gate TFTs, otherwise short circuit may occur. In the present disclosure, however, since the first bottom gate TFT 210 is located between the first top gate TFT 110 and the second top gate TFT 120, and the active layer pattern 20 of the first bottom gate TFT 210 is arranged in a layer different from the active layer pattern 20 of the first top gate TFT 110 and the active layer pattern 20 of the second top gate TFT 120, the problem of short circuit due to small spacing can be avoided. As a result, a small space is allowed between the active layer pattern 20 of the first top gate TFT 110 and the active layer pattern 20 of the first bottom gate TFT 210, and also between the active layer pattern 20 of the first bottom gate TFT 210 and the active layer pattern 20 of the second top gate TFT 120, along the first direction X. Such spacing is much smaller than the spacing between the active layer pattern of adjacent top gate TFTs or adjacent top gate TFTs in the related art, and may be zero along the first direction X.

Optionally, as shown in FIGS. 4a and 4b, the array substrate 01 further includes a first gate line 41, the gate 40 of the first top gate TFT 110, the gate 40 of the first bottom gate TFT 210 and the gate 40 of the second top gate TFT 120 are respectively part of the first gate line 41.

In this way, the first top gate TFT 110, the first bottom gate TFT 210 and the second top gate TFT 120 can be turned-on or turned-off simultaneously.

Figure 5A:
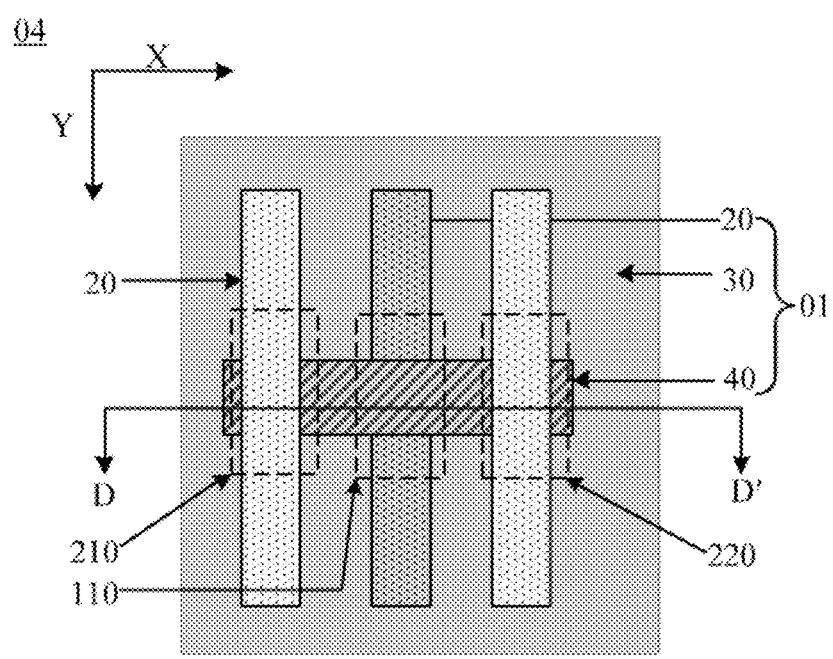
FIG. 5a is a schematic top view of another array substrate provided in the present disclosure.
Figure 5B:
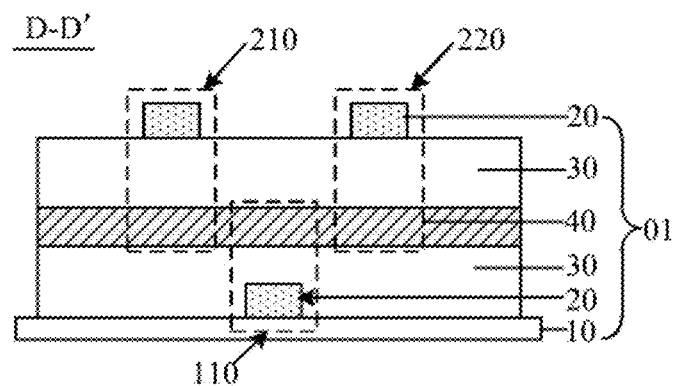
FIG. 5b is a cross-sectional diagram of FIG. 5b.

Optionally, as shown in FIGS. 5a and 5b, the at least one bottom gate TFT further includes a second bottom gate TFT 220, the first top gate TFT 110 is located between the first bottom gate TFT 210 and the second bottom gate TFT 220; the active layer pattern 20 of the first bottom gate TFT 210 and the active layer pattern 20 of the second bottom gate TFT 220 are formed in the same layer and are made of same material, the active layer pattern 20 of the second bottom gate TFT 220 extends in the second direction Y. The gate 40 of the first top gate TFT 110, the gate 40 of the first bottom gate TFT 210 and the gate 40 of the second bottom gate TFT 220 are arranged in the same layer and are made of same material.

The active layer pattern 20 of the first bottom gate TFT 210 and the active layer pattern 20 of the second bottom gate TFT 220 are arranged in the same layer and are made of same material, i.e. the active layer pattern 20 of the first bottom gate TFT 210 and the active layer pattern 20 of the second bottom gate TFT 220 can be formed through a single patterning process.

The gate 40 of the first top gate TFT 110, the gate 40 of the first bottom gate TFT 210 and the gate 40 of the second bottom gate TFT 220 are arranged in the same layer and are made of same material. That is, the gate 40 of the first top gate TFT 110, the gate 40 of the first bottom gate TFT 210 and the gate 40 of the second bottom gate TFT 220 can be formed through a single patterning process.

Since the first top gate TFT 110 is located between the first bottom gate TFT 210 and the second bottom gate TFT 220, and the active layer pattern 20 of the first top gate TFT 110 is arranged in a different layer from the active layer pattern 20 of the first bottom gate TFT 210 and the active layer pattern 20 of the second bottom gate TFT 220, a small space is allowed between the active layer pattern 20 of the first top gate TFT 110 and the active layer pattern 20 of the first bottom gate TFT 210, and also between the active layer pattern 20 of the first top gate TFT 110 and the active layer pattern 20 of the second bottom gate TFT 220, along the first direction X. Such spacing is much smaller than the spacing between the active layer pattern of adjacent top gate TFTs or adjacent top gate TFTs in the related art, and may be zero along the first direction X.

Optionally, as shown in FIGS. 5a and 5b, the array substrate 01 further includes a first gate line 41, the gate 40 of the first top gate TFT 110, the gate 40 of the first bottom gate TFT 210 and the gate 40 of the second bottom gate TFT 220 are respectively part of the first gate line 41.

In this way, the first top gate TFT 110, the first bottom gate TFT 210 and the second bottom gate TFT 220 can be turned-on or turned-off simultaneously.

Figure 6A:
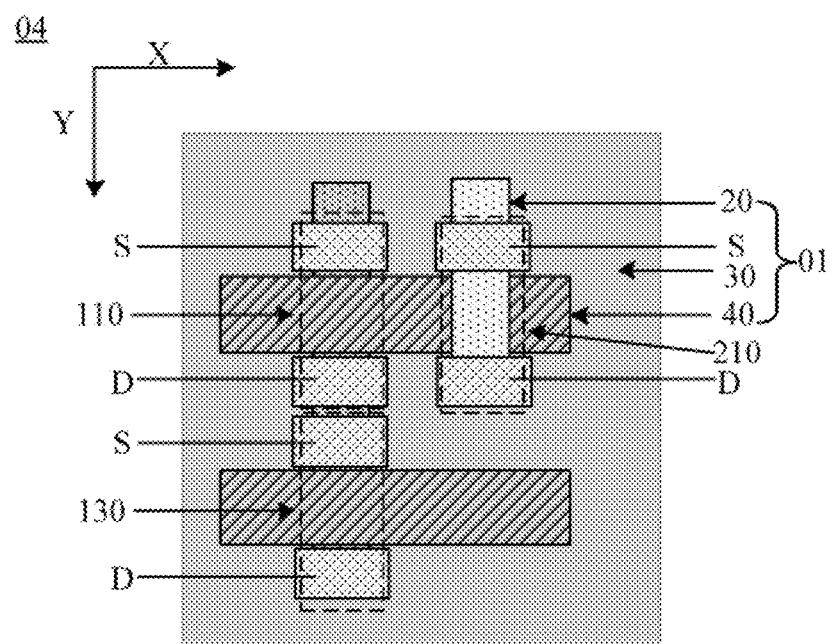
FIG. 6a is a schematic top view of another array substrate provided in the present disclosure.
Figure 6B:
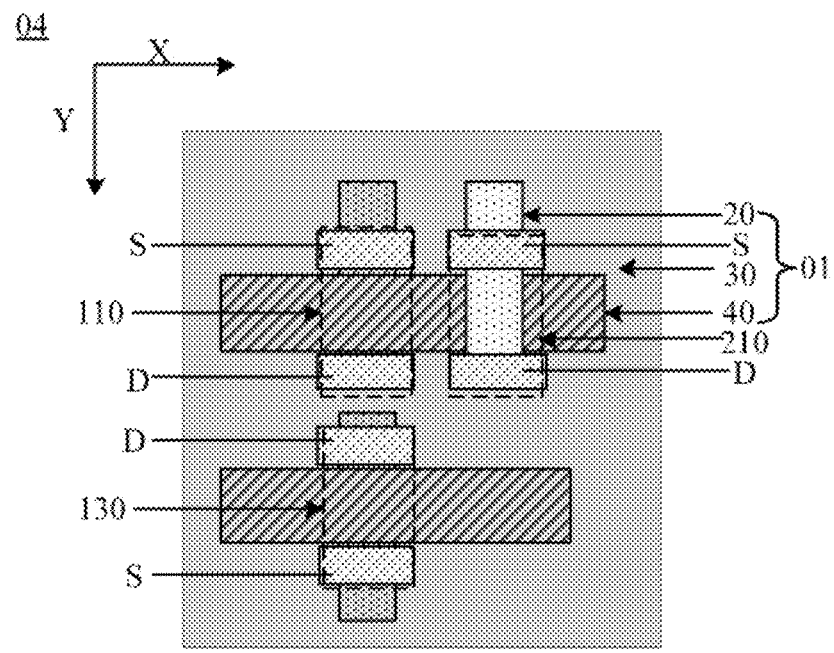
FIG. 6b is a schematic top view of another array substrate provided in the present disclosure.

Optionally, as shown in FIGS. 6a and 6b, the at least one top gate TFT further includes a third top gate TFT 130, the active layer pattern 20 of the first top gate TFT 110 and the active layer pattern 20 of the third top gate TFT 130 are formed in a same layer and connected with each other, and the active layer pattern 20 of the third top gate TFT 130 extends in the second direction.

Alternatively, as shown in FIG. 6b, the active layer pattern 20 of the first top gate TFT 110 and the active layer pattern 20 of the third top gate TFT 130 are formed in the same layer and disconnected with each other.

The active layer pattern 20 of the first top gate TFT 110 and the active layer pattern 20 of the third top gate TFT 130 may be arranged in the same layer, thereby the active layer pattern 20 of the first top gate TFT 110 and the active layer pattern 20 of the third top gate TFT 130 can be formed through a single patterning process.

It should be noted that the source S and the drain D of the TFT referred to in all embodiments of the present disclosure are symmetrical, so there is no difference between the source S and the drain D. Taking the first top gate TFT 110 as an example, the source S and drain D of the first top gate can be set in the manner shown in FIG. 6a or FIG. 6b, and the source S and drain D may also be interchanged. Similarly, the source S and drain D of the third top gate TFT 130 may also be set in the manner shown in FIG. 6a or FIG. 6b, and the source S and drain D can be interchanged.

Figure 7A:
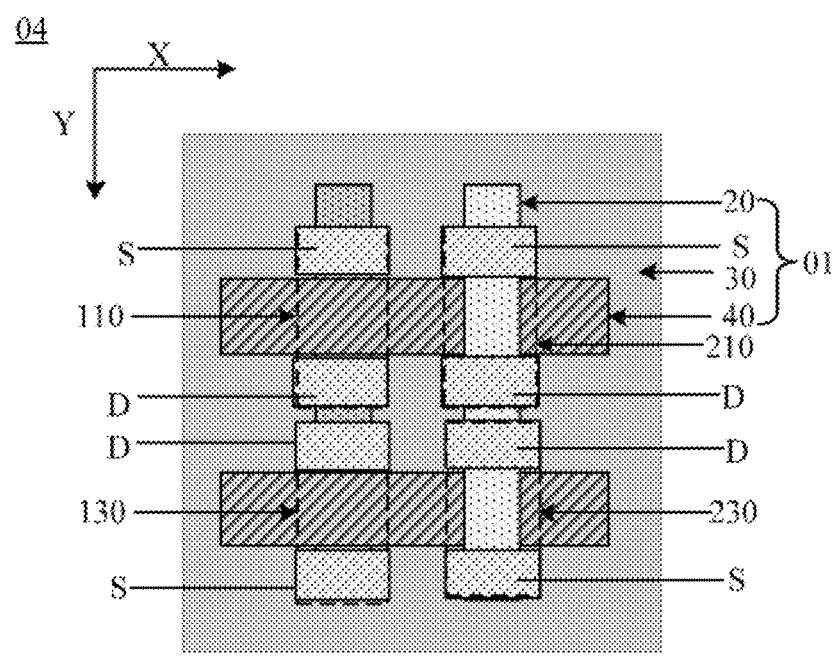
FIG. 7a is a schematic top view of another array substrate provided in the present disclosure.

On the basis of above, optionally, as shown in FIG. 7a, the at least one bottom gate TFT further includes a third bottom gate TFT 230, the active layer pattern 20 of the first bottom gate TFT 210 and the active layer pattern 20 of the third bottom gate TFT 230 are formed in a same layer and connected with each other, and the active layer pattern 20 of the third bottom gate TFT 230 extends in the second direction Y.

Figure 7B:
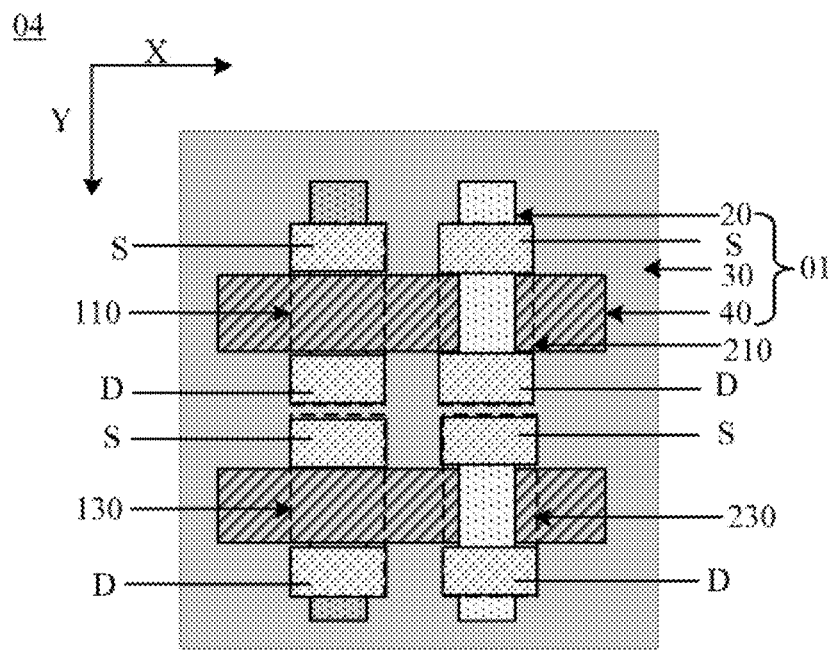
FIG. 7b is a schematic top view of another array substrate provided in the present disclosure.

Alternatively, as shown in FIG. 7b, the active layer pattern 20 of the first bottom gate TFT 210 and the active layer pattern 20 of the third bottom gate TFT 230 are formed in the same layer and disconnected with each other.

The active layer pattern 20 of the first bottom gate TFT 210 and the active layer pattern 20 of the third bottom gate TFT 230 may be arranged in the same layer, thereby the active layer pattern 20 of the first bottom gate TFT 210 and the active layer pattern 20 of the third bottom gate TFT 230 can be formed through a single patterning process.

It should be noted that the source S and the drain D of the TFT referred to in all embodiments of the present disclosure are symmetrical, so there is no difference between the source S and the drain D. Taking the first bottom gate TFT 210 as an example, the source S and drain D of the first top gate can be set in the manner shown in FIG. 7a or FIG. 7b, and the source S and drain D may also be interchanged. Similarly, the source S and drain D of the third bottom gate TFT 230 may also be set in the manner shown in FIG. 7a or FIG. 7b, and the source S and drain D can be interchanged.

Figure 8A:
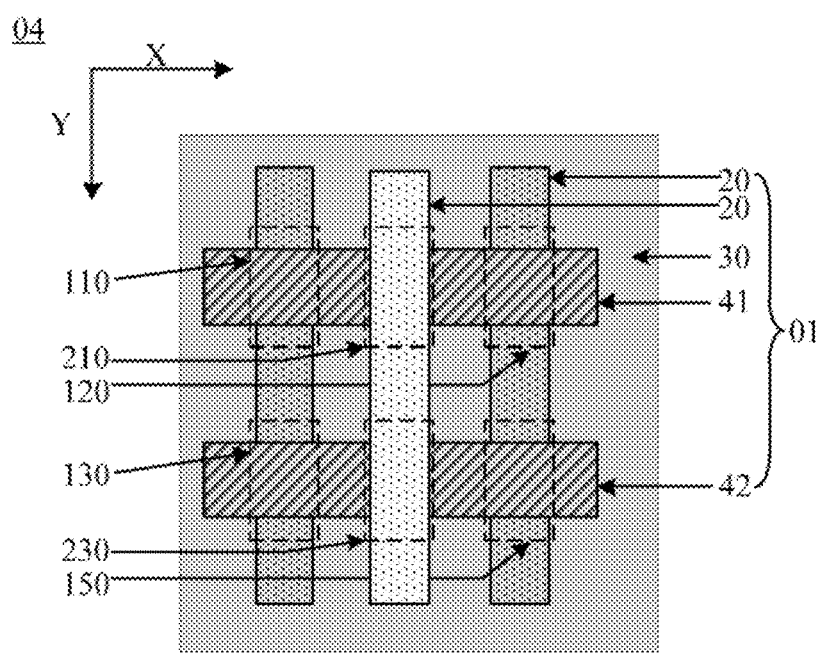
FIG. 8a is a schematic top view of another array substrate provided in the present disclosure.

Optionally, as shown in FIG. 8a, in the case that the at least one top gate TFT includes the second top gate TFT 120, the at least one top gate TFT further includes a fifth top gate TFT 150, the active layer pattern 20 of the second top gate TFT 120 and the active layer pattern 20 of the fifth top gate TFT 150 are formed in a same layer and connected with each other, and the active layer pattern 20 of the fifth top gate TFT 150 extends in the second direction Y.

Figure 8B:
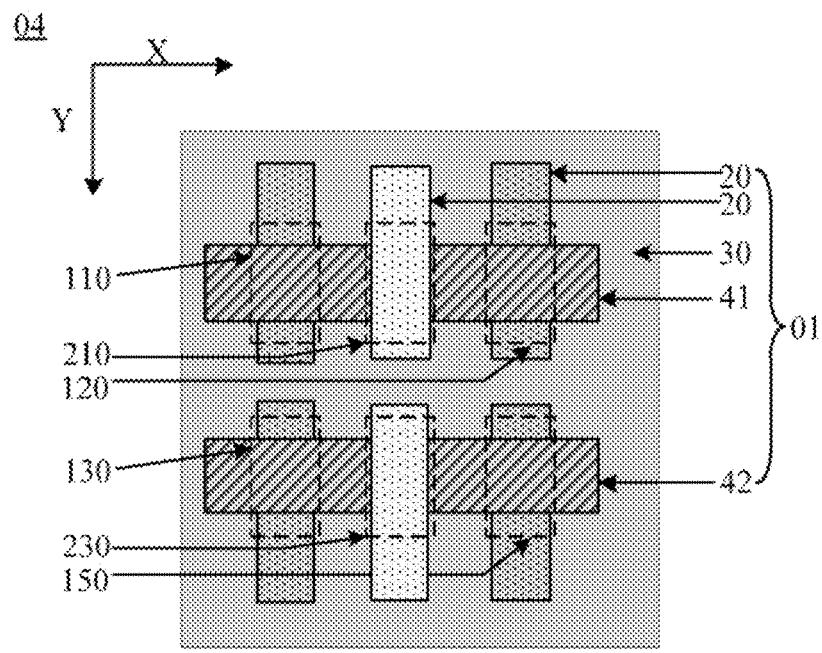
FIG. 8b is a schematic top view of another array substrate provided in the present disclosure.

Alternatively, as shown in FIG. 8b, the active layer pattern 20 of the second top gate TFT 120 and the active layer pattern 20 of the fifth top gate TFT 150 are formed in the same layer and disconnected with each other.

The active layer pattern 20 of the second top gate TFT 120 and the active layer pattern 20 of the fifth top gate TFT 150 are arranged in the same layer, thereby the active layer pattern 20 of the second top gate TFT 120 and the active layer pattern 20 of the fifth top gate TFT 150 can be formed through a single patterning process.

It should be understood that, the third bottom gate TFT 230 is arranged between the third top gate TFT 130 and the fifth top gate TFT 150, the active layer pattern 20 of the third top gate TFT 130 and the active layer pattern 20 of the fifth top gate TFT 150 are arranged in the same layer. In this case, the active layer pattern 20 of the first bottom gate TFT 210 and the active layer pattern 20 of the third bottom gate TFT 230 may be arranged in the same layer.

Optionally, the array substrate 01 further includes a second gate line 42, the gate 40 of the third top gate TFT 130, the gate 40 of the third bottom gate TFT 230 and the gate 40 of the fifth top gate TFT 150 are respectively part of the second gate line 42.

The first gate line 41 and the second gate line 42 can be arranged in parallel with each other.

Figure 9A:
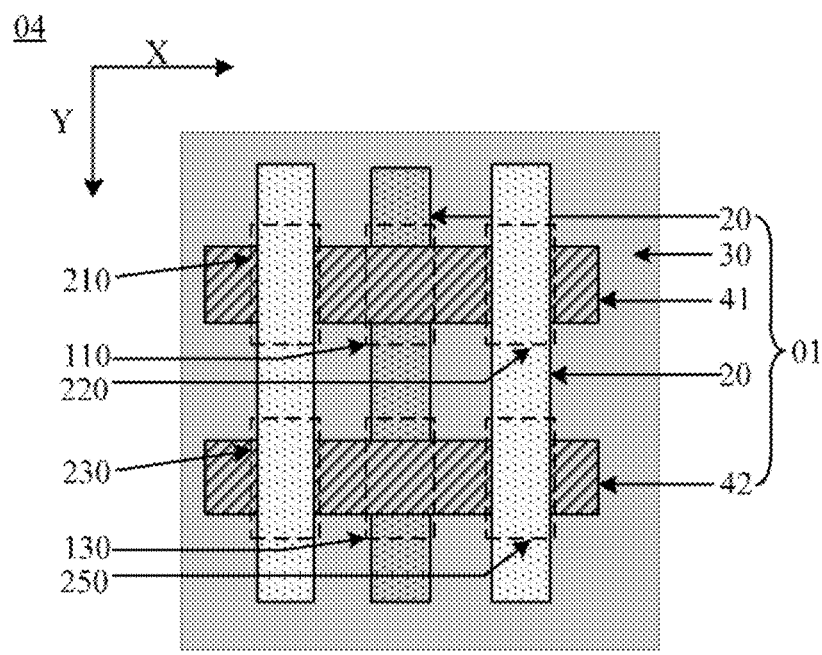
FIG. 9a is a top view diagram of another array substrate provided in the present disclosure.

Optionally, as shown in FIG. 9a, in the case that the at least one bottom gate TFT includes the second bottom gate TFT 220, the at least one bottom gate TFT further includes a fifth bottom gate TFT 250, the active layer pattern 20 of the second bottom gate TFT 220 and the active layer pattern 20 of the fifth bottom gate TFT 250 are formed in a same layer and connected with each other, and the active layer pattern 20 of the fifth bottom gate TFT 250 extends in the second direction Y.

Figure 9B:
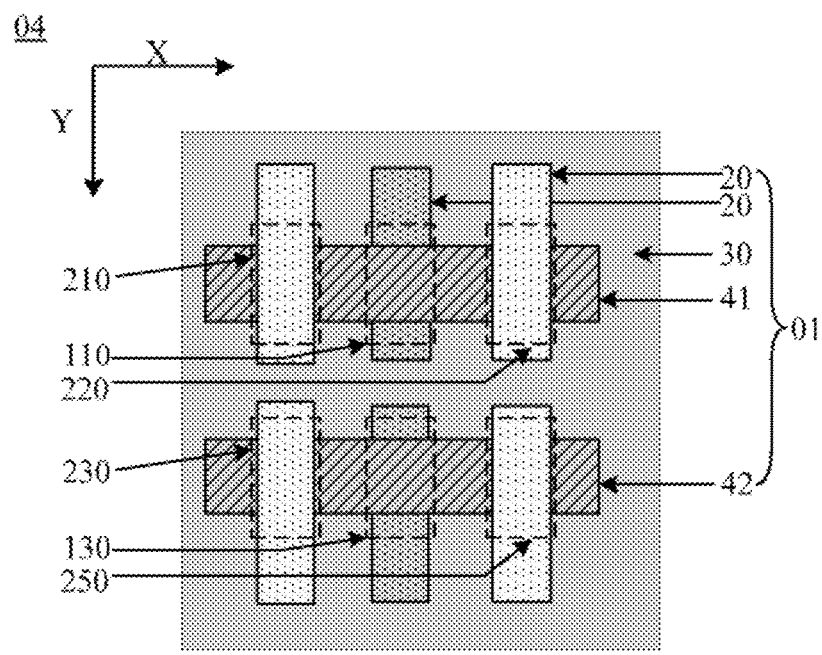
FIG. 9b is a schematic top view of another array substrate provided in the present disclosure.

Alternatively, as shown in FIG. 9b, the active layer pattern 20 of the second bottom gate TFT 220 and the active layer pattern 20 of the fifth bottom gate TFT 250 are formed in the same layer and disconnected with each other.

The active layer pattern 20 of the second bottom gate TFT 220 and the active layer pattern 20 of the fifth bottom gate TFT 250 are arranged in the same layer, thereby the active layer pattern 20 of the second bottom gate TFT 220 and the active layer pattern 20 of the fifth bottom gate TFT 250 can be formed through a single patterning process.

It should be understood that, the third top gate TFT 130 is arranged between the third bottom gate TFT 230 and the fifth bottom gate TFT 250, the active layer pattern 20 of the third bottom gate TFT 230 and the active layer pattern 20 of the fifth bottom gate TFT 250 are arranged in the same layer. In this case, the active layer pattern 20 of the first top gate TFT 110 and the active layer pattern 20 of the third top gate TFT 130 may be arranged in the same layer.

Optionally, the array substrate 01 further includes a second gate line 42, the gate 40 of the third top gate TFT 130, the gate 40 of the third bottom gate TFT 230 and the gate 40 of the fifth bottom gate TFT 250 are respectively part of the second gate line 42.

Figure 10A:
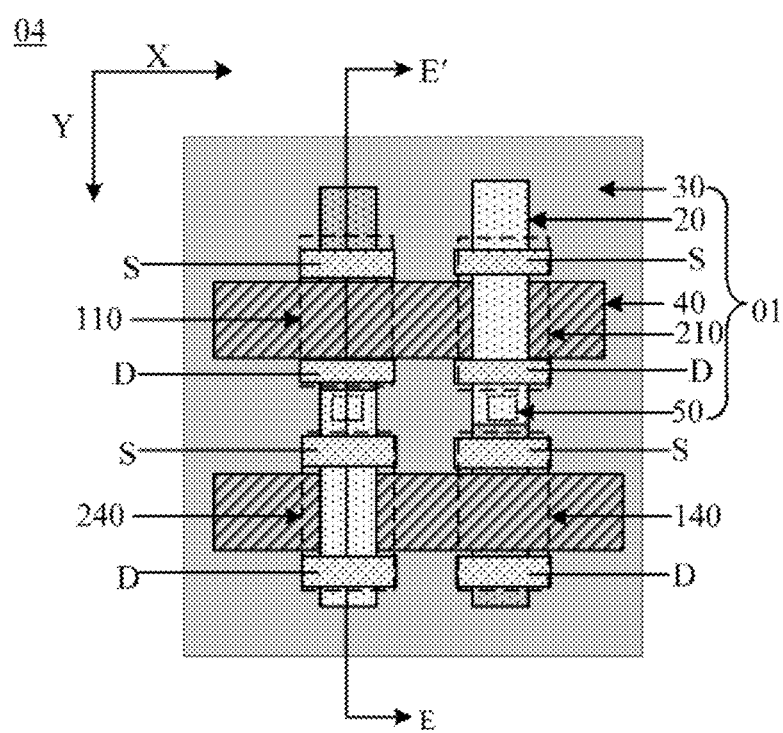
FIG. 10a is a schematic top view of another array substrate provided in the present disclosure.
Figure 10B:
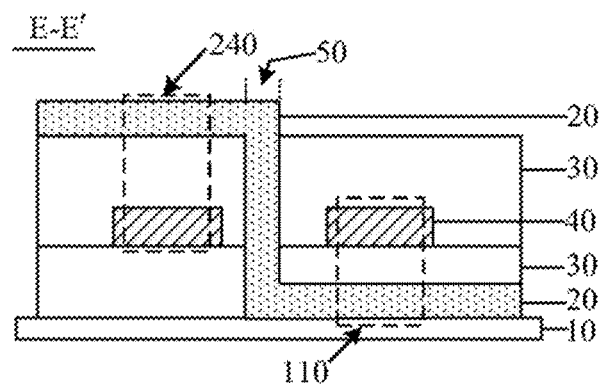
Figure 10C:
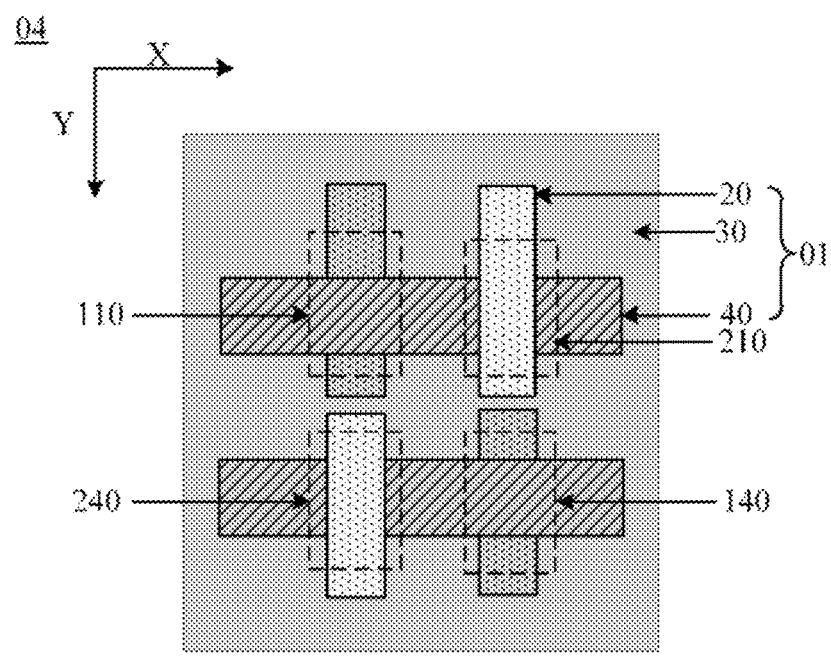
FIG. 10c is a schematic top view of another array substrate provided in the present disclosure.

Optionally, as shown in FIGS. 10a, 10b and 10c, the at least one bottom gate TFT further includes a fourth bottom gate TFT 240, the active layer pattern 20 of the first top gate TFT 110 and the active layer pattern 20 of the fourth bottom gate TFT 240 are formed in different layers, and the active layer pattern 20 of the fourth bottom gate TFT 240 extends in the second direction Y.

Optionally, as shown in FIGS. 10a and 10b, the active layer pattern 20 of the first top gate TFT 110 and the active layer pattern 20 of the fourth bottom gate TFT 240 may be connected through a via hole 50.

The active layer pattern 20 of the first top gate TFT 110 and the active layer pattern 20 of the fourth bottom gate TFT 240 are formed in different layers, that is, along the thickness direction of the array substrate, additional layer is disposed between the active layer pattern 20 of the first top gate TFT 110 and the active layer pattern 20 of the fourth bottom gate TFT 240. During manufacturing, the active layer pattern 20 of the first top gate TFT 110 and the active layer pattern 20 of the fourth bottom gate TFT 240 can be respectively formed through two patterning processes.

Alternatively, as shown in FIG. 10c, the active layer pattern 20 of the first top gate TFT 110 and the active layer pattern 20 of the fourth bottom gate TFT 240 are arranged in different layers, insulated and spaced from each other.

Of course, optionally, the active layer pattern 20 of the first top gate TFT 110 and the active layer pattern 20 of the fourth bottom gate TFT 240 may be insulated from each other, and the orthographic projections thereof on the substrate are not spaced from each other and do not overlap each other.

It should be understood that, the active layer pattern 20 of the first top gate TFT 110 and the active layer pattern 20 of the fourth bottom gate TFT 240 are arranged in different layers, such that the layout of the first top gate TFT 110 and the fourth bottom gate TFT 240 is not restricted by the necessary spacing between the top gate TFTs arranged in the same layer or the bottom gate TFTs arranged in the same layer, as in the related art. Therefore the distance between the orthographic projections of the first top gate TFT 110 and the fourth bottom gate TFT 240 on the substrate can be reduced, the area occupied by the sub-pixel region 04 is also reduced, thereby a compact circuit layout can be implemented.

Figure 11A:
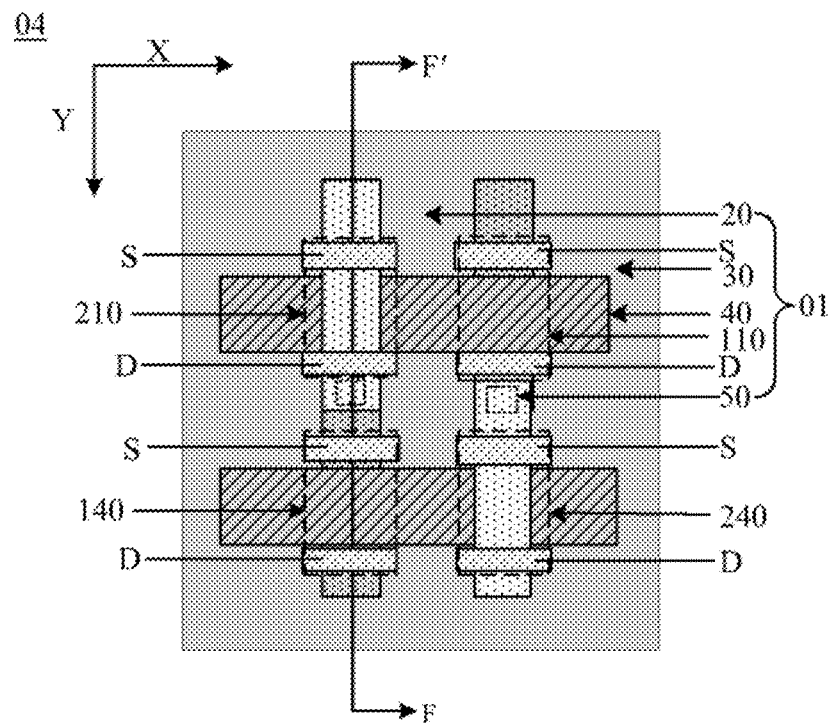
FIG. 11a is a top view diagram of another array substrate provided in the present disclosure.
Figure 11B:
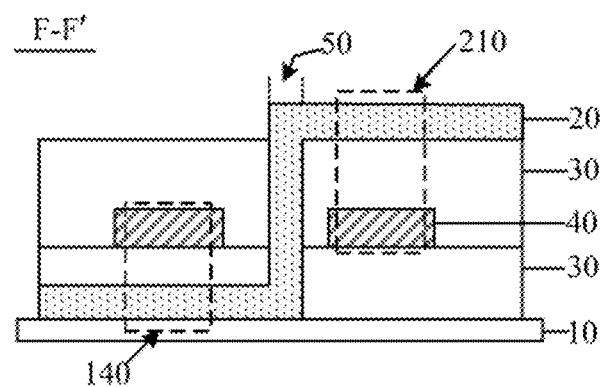
Figure 11C:
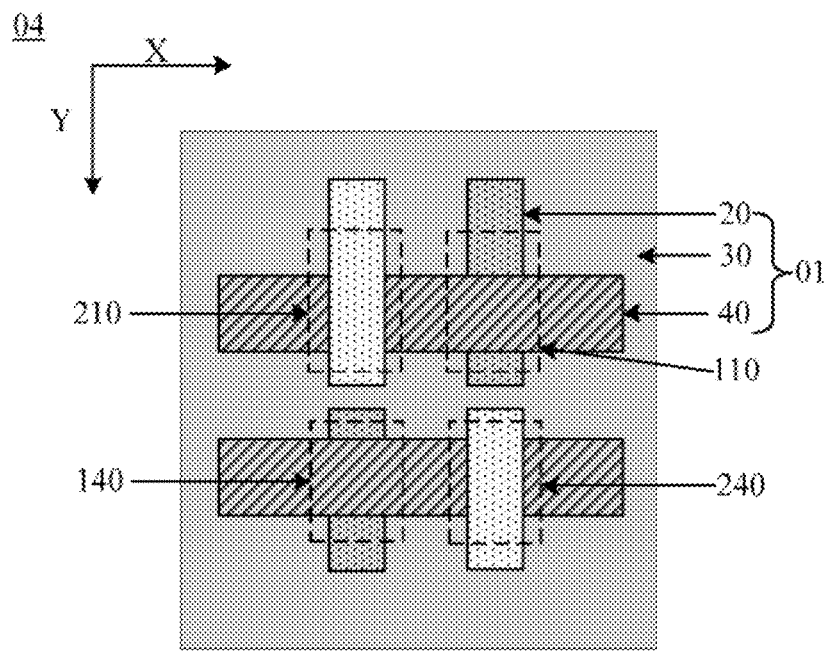
FIG. 11c is a schematic top view of another array substrate provided in the present disclosure.

Optionally, as shown in FIGS. 11a, 11b and 11c, the at least one top gate TFT further includes a fourth top gate TFT 140, the active layer pattern 20 of the first bottom gate TFT 210 and the active layer pattern 20 of the fourth top gate TFT 140 are formed in different layers, and the active layer pattern 20 of the fourth top gate TFT 140 extends in the second direction Y.

Optionally, as shown in FIGS. 11a and 11b, the active layer pattern 20 of the first bottom gate TFT 210 and the active layer pattern 20 of the fourth top gate TFT 140 may be connected through a via hole 50.

The active layer pattern 20 of the first bottom gate TFT 210 and the active layer pattern 20 of the fourth top gate TFT 140 are formed in different layers, that is, along the thickness direction of the array substrate, additional layer is disposed between the active layer pattern 20 of the first bottom gate TFT 210 and the active layer pattern 20 of the fourth top gate TFT 140. During manufacturing, the active layer pattern 20 of the first bottom gate TFT 210 and the active layer pattern 20 of the fourth top gate TFT 140 can be respectively formed through two patterning processes.

Alternatively, as shown in FIG. 11c, the active layer pattern 20 of the first bottom gate TFT 210 and the active layer pattern 20 of the fourth top gate TFT 140 are arranged in different layers, insulated and spaced from each other.

Of course, optionally, the active layer pattern 20 of the first bottom gate TFT 210 and the active layer pattern 20 of the fourth top gate TFT 140 may be insulated from each other, and the orthographic projections thereof on the substrate are not spaced from each other and do not overlap each other.

It should be understood that, the active layer pattern 20 of the first bottom gate TFT 210 and the active layer pattern 20 of the fourth top gate TFT 140 are arranged in different layers, such that the layout of the first bottom gate TFT 210 and the fourth top gate TFT 140 is not restricted by the necessary spacing between the top gate TFTs arranged in the same layer or the bottom gate TFTs arranged in the same layer, as in the related art. Therefore the distance between the orthographic projections of the first bottom gate TFT 210 and the fourth top gate TFT 140 on the substrate can be reduced, the area occupied by the sub-pixel region 04 is also reduced, thereby a compact circuit layout can be implemented.

Figure 12A:
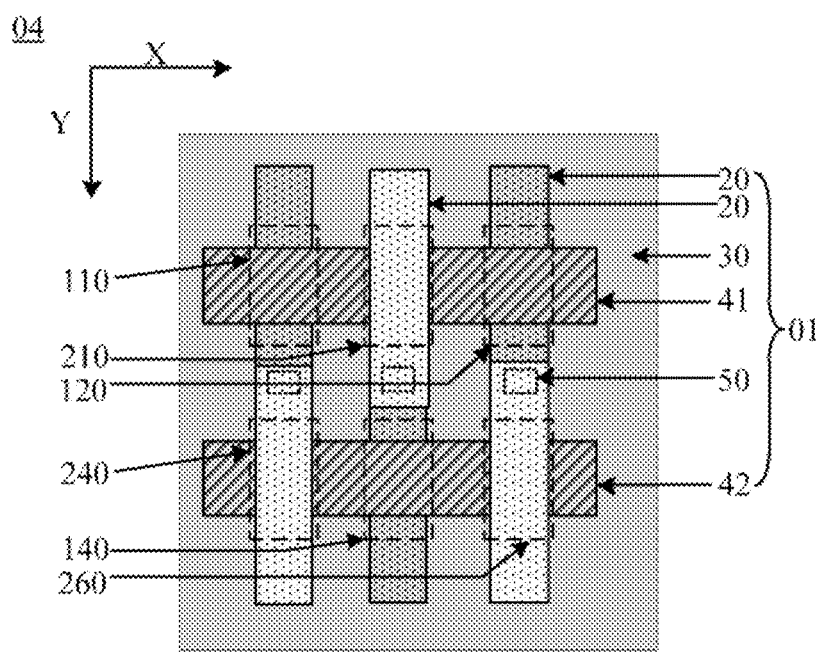
FIG. 12a is a schematic top view of another array substrate provided in the present disclosure.
Figure 12B:
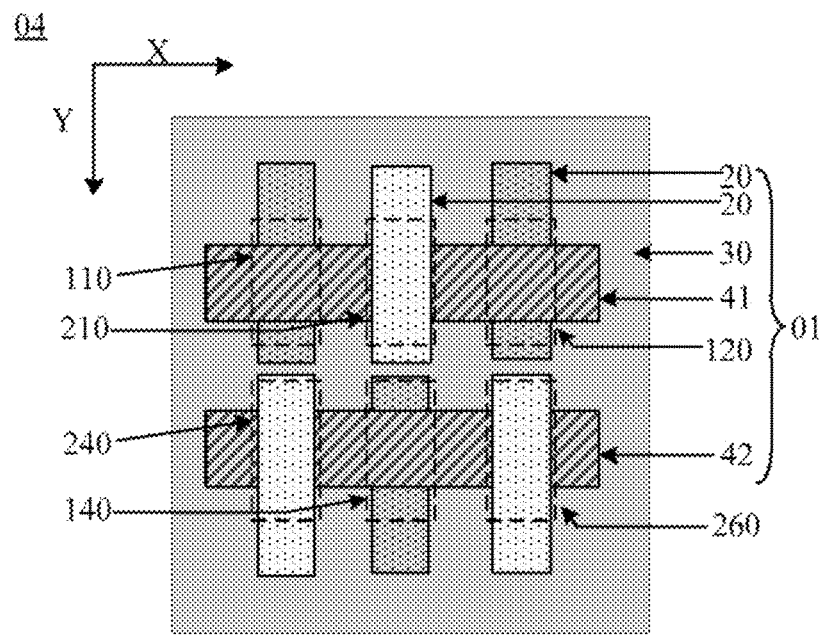
FIG. 12b is a schematic top view of another array substrate provided in the present disclosure.

Optionally, as shown in FIGS. 12a and 12b, in the case that the at least one top gate TFT includes the second top gate TFT 120, the at least one bottom gate TFT further includes a sixth bottom gate TFT 260, the active layer pattern 20 of the second top gate TFT 120 and the active layer pattern 20 of the sixth bottom gate TFT 260 are formed in different layers, and the active layer pattern 20 of the sixth bottom gate TFT 260 extends in the second direction Y.

Optionally, as shown in FIG. 12a, the active layer pattern 20 of the second top gate TFT 120 and the active layer pattern 20 of the sixth bottom gate TFT 260 may be connected through a via hole 50.

The active layer pattern 20 of the second top gate TFT 120 and the active layer pattern 20 of the sixth bottom gate TFT 260 are formed in different layers, that is, along the thickness direction of the array substrate, additional layer is disposed between the active layer pattern 20 of the second top gate TFT 120 and the active layer pattern 20 of the sixth bottom gate TFT 260. During manufacturing, the active layer pattern 20 of the second top gate TFT 120 and the active layer pattern 20 of the sixth bottom gate TFT 260 can be respectively formed through two patterning processes.

Alternatively, as shown in FIG. 12b, the active layer pattern 20 of the second top gate TFT 120 and the active layer pattern 20 of the sixth bottom gate TFT 260 are arranged in different layers, insulated and spaced from each other.

Of course, optionally, the active layer pattern 20 of the second top gate TFT 120 and the active layer pattern 20 of the sixth bottom gate TFT 260 may be insulated from each other, and the orthographic projections thereof on the substrate are not spaced from each other and do not overlap each other.

It should be understood that, the fourth top gate TFT 140 is arranged between the fourth bottom gate TFT 240 and the sixth bottom gate TFT 260, the active layer pattern 20 of the fourth bottom gate TFT 240 and the active layer pattern 20 of the sixth bottom gate TFT 260 may be arranged in the same layer.

Optionally, as shown in FIGS. 12a and 12b, the array substrate 01 further includes a second gate line 42, the gate 40 of the fourth bottom gate TFT 240, the gate 40 of the fourth top gate TFT 140 and the gate 40 of the sixth bottom gate TFT 260 are respectively part of the second gate line 42.

Figure 13A:
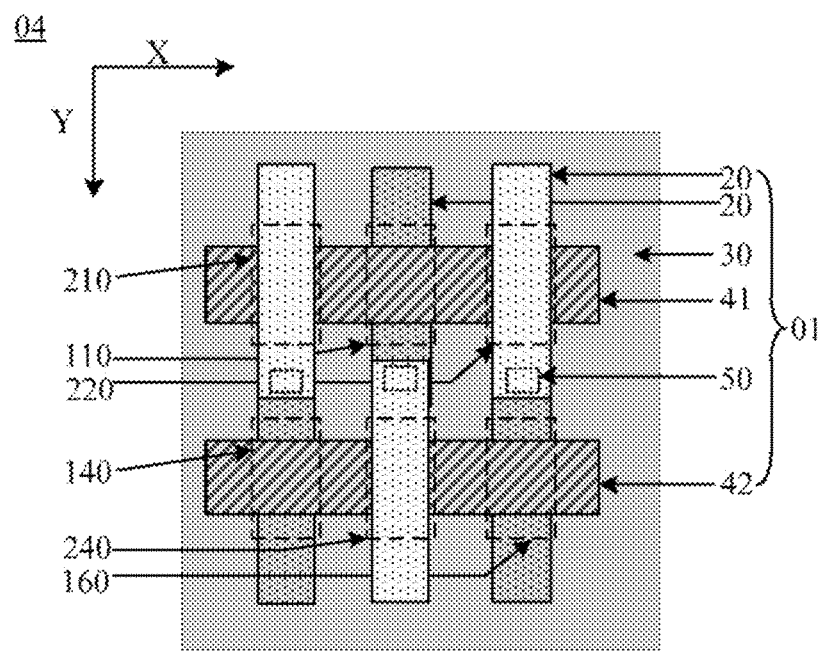
FIG. 13a is a schematic top view of another array substrate provided in the present disclosure.

Optionally, as shown in FIG. 13a, in the case that the at least one bottom gate TFT includes the second bottom gate TFT 220, the at least one top gate TFT further includes a sixth top gate TFT 160, the active layer pattern 20 of the second bottom gate TFT 220 and the active layer pattern 20 of the sixth top gate TFT 260 are formed in different layers, and the active layer pattern 20 of the sixth top gate TFT 160 extends in the second direction Y.

Optionally, as shown in FIG. 13a, the active layer pattern 20 of the second bottom gate TFT 220 and the active layer pattern 20 of the sixth top gate TFT 160 may be connected through a via hole 50.

The active layer pattern 20 of the second bottom gate TFT 220 and the active layer pattern 20 of the sixth top gate TFT 260 are formed in different layers, that is, along the thickness direction of the array substrate, additional layer is disposed between the active layer pattern 20 of the second bottom gate TFT 220 and the active layer pattern 20 of the sixth top gate TFT 160. During manufacturing, the active layer pattern 20 of the second bottom gate TFT 220 and the active layer pattern 20 of the sixth top gate TFT 160 can be respectively formed through two patterning processes.

Figure 13B:
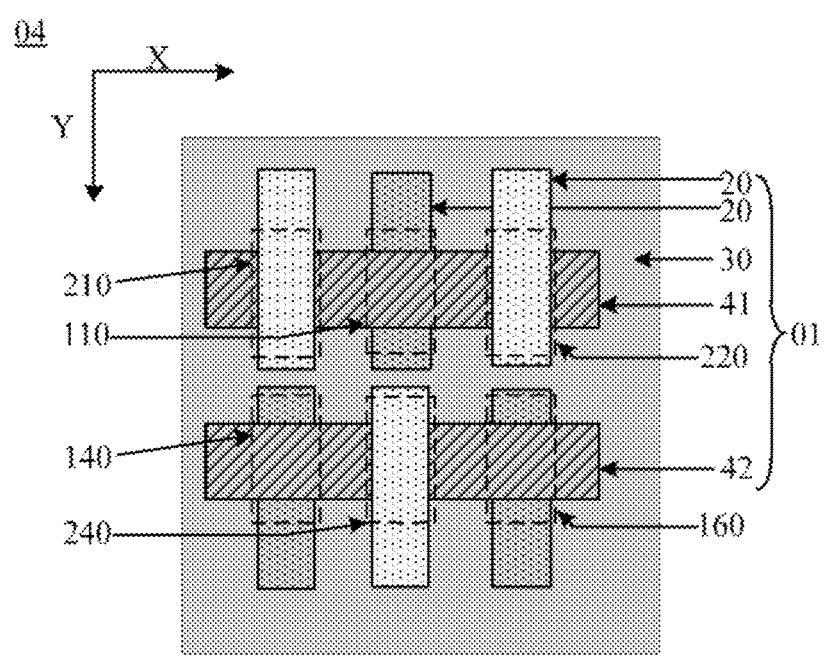
FIG. 13b is a schematic top view of another array substrate provided in the present disclosure.

Alternatively, as shown in FIG. 13b, the active layer pattern 20 of the second bottom gate TFT 220 and the active layer pattern 20 of the sixth top gate TFT 160 are arranged in different layers, insulated and spaced from each other.

Of course, optionally, the active layer pattern 20 of the second bottom gate TFT 220 and the active layer pattern 20 of the sixth top gate TFT 160 may be insulated from each other, and the orthographic projections thereof on the substrate are not spaced from each other and do not overlap each other.

It should be understood that, the fourth bottom gate TFT 240 is arranged between the fourth top gate TFT 140 and the sixth top gate TFT 160, the active layer pattern 20 of the fourth top gate TFT 140 and the active layer pattern 20 of the sixth top gate TFT 160 may be arranged in the same layer.

Optionally, the array substrate 01 further includes a second gate line 42, the gate 40 of the fourth bottom gate TFT 240, the gate 40 of the fourth top gate TFT 140 and the gate 40 of the sixth top gate TFT 160 are respectively part of the second gate line 42.

According to some embodiments of the present disclosure, a manufacturing method of an array substrate is provided, the array substrate comprises a substrate, the first top gate TFT and the first bottom gate TFT.

Figure 14:
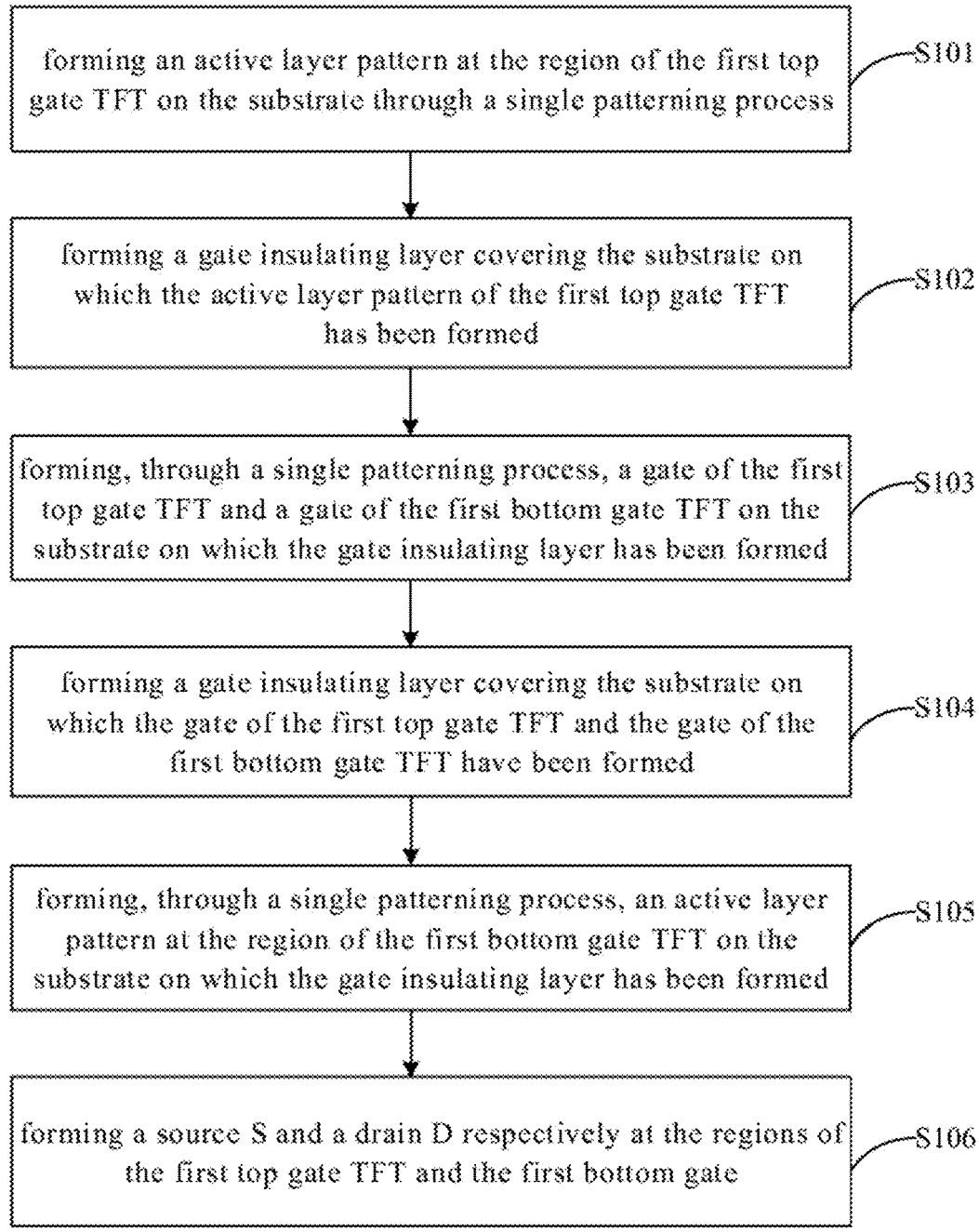
FIG. 14 is a schematic diagram of a manufacturing method of the array substrate provided in the present disclosure.

As shown in FIG. 14, the manufacturing method of the array substrate includes:

S101, as shown in FIGS. 3a and 3b, forming, through a single patterning process, an active layer pattern 20 at the region of the first top gate TFT 110 on the substrate;

S102, as shown in FIGS. 3a and 3b, forming a gate insulating layer 30 covering the substrate on which an active layer pattern 20 of the first top gate TFT 110 has been formed;

S103, as shown in FIGS. 3a and 3b, forming, through a single patterning process, a gate of the first top gate TFT 110 at the region of the first top gate TFT 110, and a gate of the first bottom gate TFT 210 at the region of the first bottom gate TFT 210, on the substrate on which the gate insulating layer 30 has been formed;

S104, as shown in FIGS. 3a and 3b, forming a gate insulating layer 30 covering the substrate on which the gate of the first top gate TFT 110 and the gate of the first bottom gate TFT 210 have been formed; and S105, as shown in FIGS. 3a and 3b, forming, through a single patterning process, an active layer pattern 20 at the region of the first bottom gate TFT 210 on the substrate on which the gate insulating layer 30 has been formed.

An active layer pattern 20 of the first top gate TFT 110 and an active layer pattern 20 of the first bottom gate TFT 210 are respectively arranged along the first direction X and disposed on different layers. Both the active layer pattern 20 of the first top gate TFT 110 and the active layer pattern 20 of the first bottom gate TFT 210 extend in a second direction Y.

S106, as shown in FIGS. 3a and 3b, forming a source S and a drain D respectively at the regions of the first top gate TFT 110 and the first bottom gate TFT 210.

The patterning process includes film formation, exposure, development and so on.

The manufacturing method of the array substrate provided by the embodiments of the present disclosure has the same beneficial effect as the array substrate 01 described above, and will not be repeated here.

According to some embodiments of the present disclosure, a manufacturing method of an array substrate is provided, the array substrate comprises the substrate, the first top gate TFT, the second top gate TFT and the first bottom gate TFT arranged between the first top gate TFT and the second top gate TFT.

Figure 15:
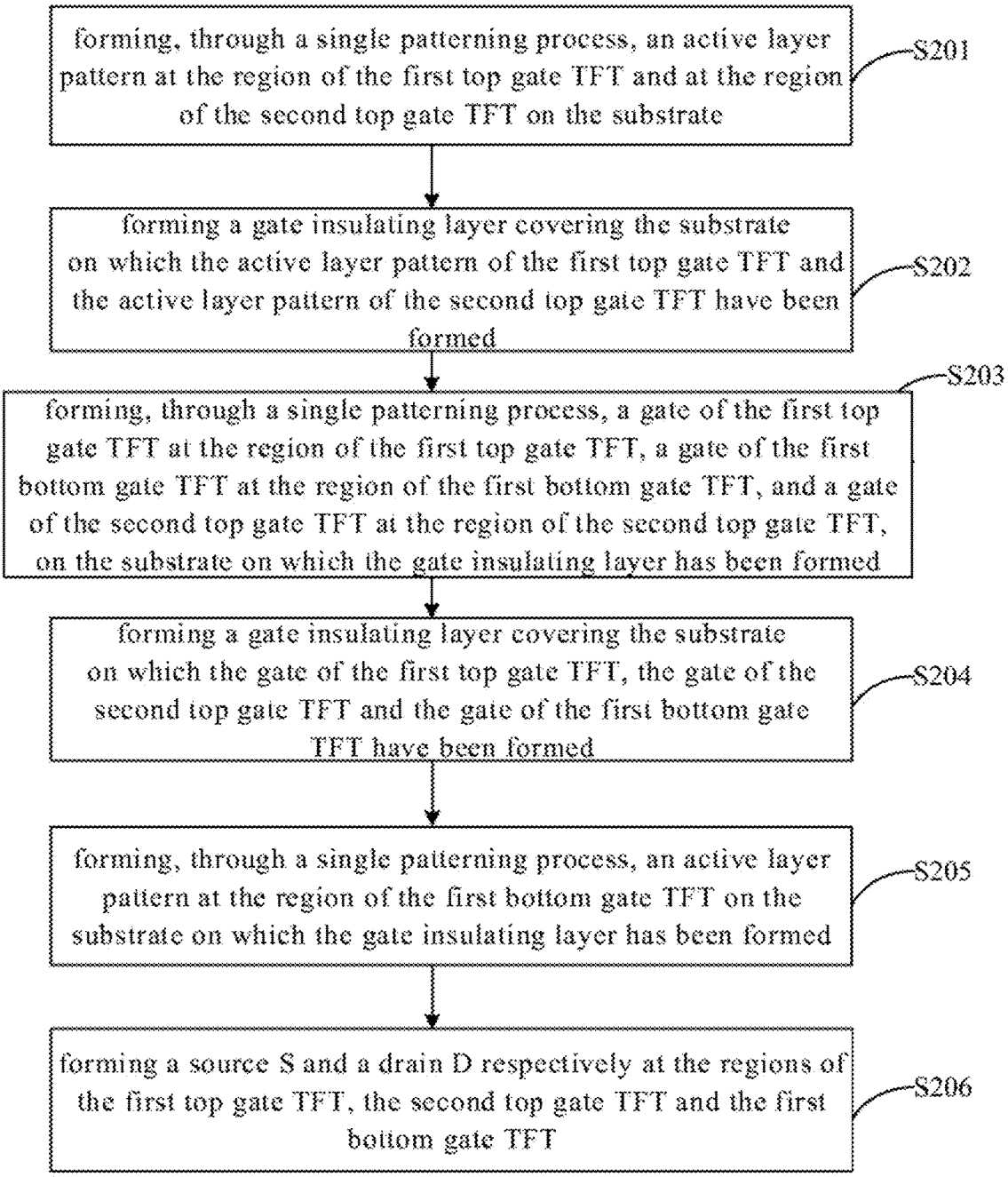
FIG. 15 is a schematic diagram of another manufacturing method of the array substrate provided in the present disclosure.

As shown in FIG. 15, the manufacturing method of the array substrate includes:

S201, as shown in FIGS. 4a and 4b, forming, through a single patterning process, an active layer pattern 20 at the region of the first top gate TFT 110 and at the region of the second top gate TFT 120 on the substrate.

The active layer pattern 20 of the first top gate TFT 110 and the active layer pattern 20 of the second top gate TFT 120 are arranged along the first direction X and formed in a same layer, the active layer pattern 20 of the first top gate TFT 110 and the active layer pattern 20 of the second top gate TFT 120 both extend in the second direction Y.

S202, as shown in FIGS. 4a and 4b, forming a gate insulating layer 30 covering the substrate on which the active layer pattern 20 of the first top gate TFT 110 and the active layer pattern 20 of the second top gate TFT 120 have been formed.

S203, as shown in FIGS. 4a and 4b, forming, through a single patterning process, a gate of the first top gate TFT 110 at the region of the first top gate TFT 110, a gate of the first bottom gate TFT 210 at the region of the first bottom gate TFT 210, and a gate of the second top gate TFT 120 at the region of the second top gate TFT 120, on the substrate on which the gate insulating layer 30 has been formed.

S204, as shown in FIGS. 4a and 4b, forming a gate insulating layer 30 covering the substrate on which the gate of the first top gate TFT 110, the gate of the second top gate TFT 120 and the gate of the first bottom gate TFT 210 have been formed.

S205, as shown in FIGS. 4a and 4b, forming, through a single patterning process, an active layer pattern 20 at the region of the first bottom gate TFT 210 on the substrate on which the gate insulating layer 30 has been formed.

The active layer pattern of the first bottom gate TFT 210 extends in the second direction Y.

S206, as shown in FIGS. 4a and 4b, forming a source S and a drain D respectively at the regions of the first top gate TFT 110, the second top gate TFT 120 and the first bottom gate TFT 210.

The manufacturing method of the array substrate provided by the embodiments of the present disclosure has the same beneficial effect as the array substrate 01 described above, and will not be repeated here.

According to some embodiments of the present disclosure, a manufacturing method of an array substrate is provided, the array substrate comprises the substrate, the first bottom gate TFT, the second bottom gate TFT and the first top gate TFT arranged between the first bottom gate TFT and the second bottom gate TFT.

Figure 16:
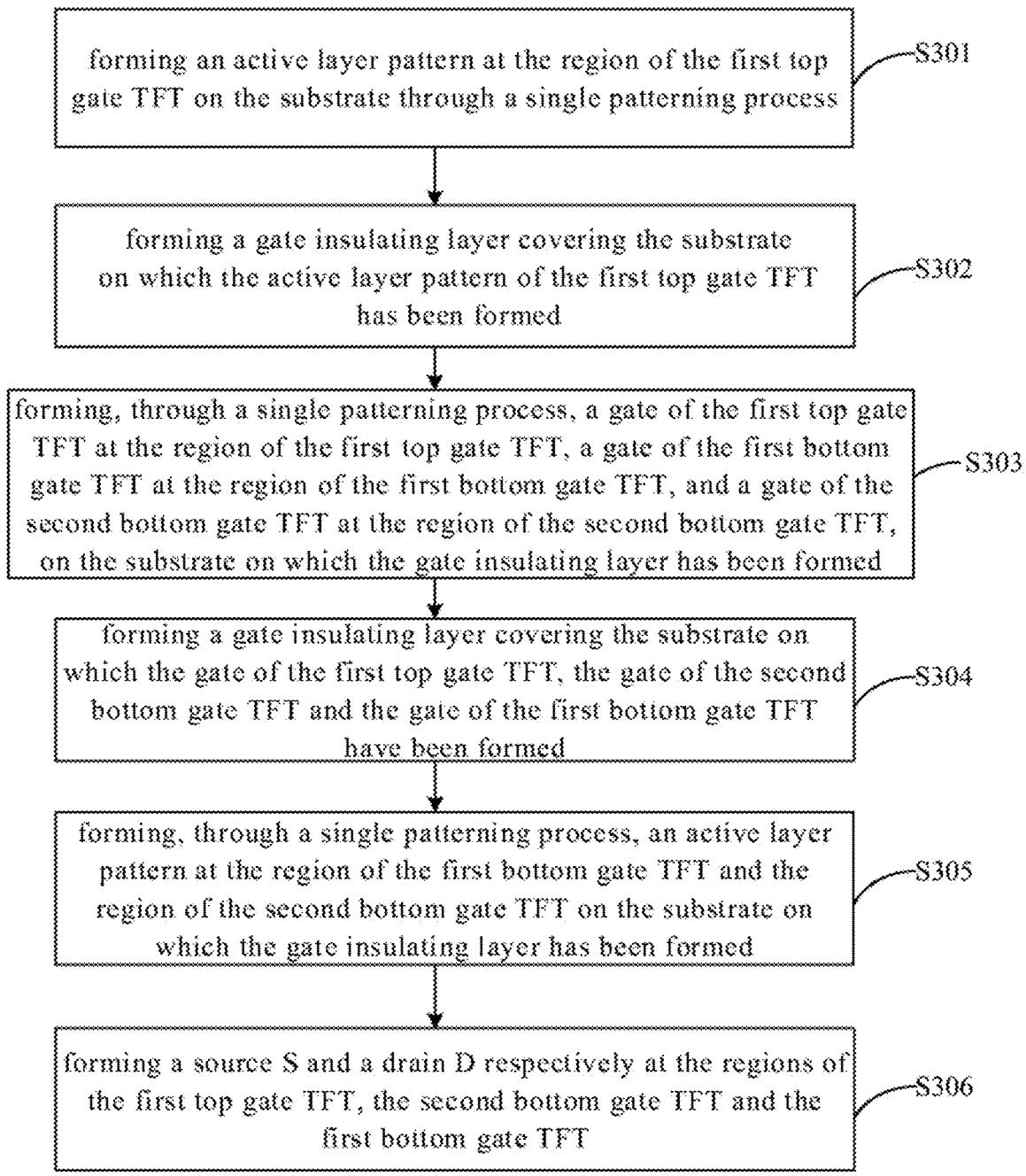
FIG. 16 is a schematic diagram of another manufacturing method of an array substrate provided in the present disclosure.

As shown in FIG. 16, the manufacturing method of the array substrate includes:

S301, as shown in FIGS. 5a and 5b, forming, through a single patterning process, an active layer pattern 20 at the region of the first top gate TFT 110 on the substrate.

The active layer pattern 20 of the first top gate TFT 110 extends along the second direction Y.

S302, as shown in FIGS. 5a and 5b, forming a gate insulating layer 30 covering the substrate on which the active layer pattern 20 of the first top gate TFT 110 has been formed.

S303, as shown in FIGS. 5a and 5b, forming, through a single patterning process, a gate of the first top gate TFT 110 at the region of the first top gate TFT 110, a gate of the first bottom gate TFT 210 at the region of the first bottom gate TFT 210, and a gate of the second bottom gate TFT 220 at the region of the second bottom gate TFT 220, on the substrate on which the gate insulating layer 30 has been formed.

S304, as shown in FIGS. 5a and 5b, forming a gate insulating layer 30 covering the substrate on which the gate of the first top gate TFT 110, the gate of the second bottom gate TFT 220 and the gate of the first bottom gate TFT 210 have been formed.

S305, as shown in FIGS. 5a and 5b, forming, through a single patterning process, an active layer pattern 20 at the region of the first bottom gate TFT 210 and the region of the second bottom gate TFT 220 on the substrate on which the gate insulating layer 30 has been formed.

The active layer pattern 20 of the first bottom gate TFT 210 and the active layer pattern 20 of the second bottom gate TFT 220 are arranged along the first direction X and formed in a same layer, the active layer pattern 20 of the first bottom gate TFT 210 and the active layer pattern 20 of the second bottom gate TFT 220 both extend in the second direction Y.

S306, as shown in FIGS. 5a and 5b, forming a source S and a drain D respectively at the regions of the first top gate TFT 110, the second bottom gate TFT 220 and the first bottom gate TFT 210.

The manufacturing method of the array substrate provided by the embodiments of the present disclosure has the same beneficial effect as the array substrate 01 described above, and will not be repeated here.

According to some embodiments of the present disclosure, a manufacturing method of an array substrate is provided, the array substrate comprises the first top gate TFT, the first bottom gate TFT and the third top gate TFT.

Figure 17:
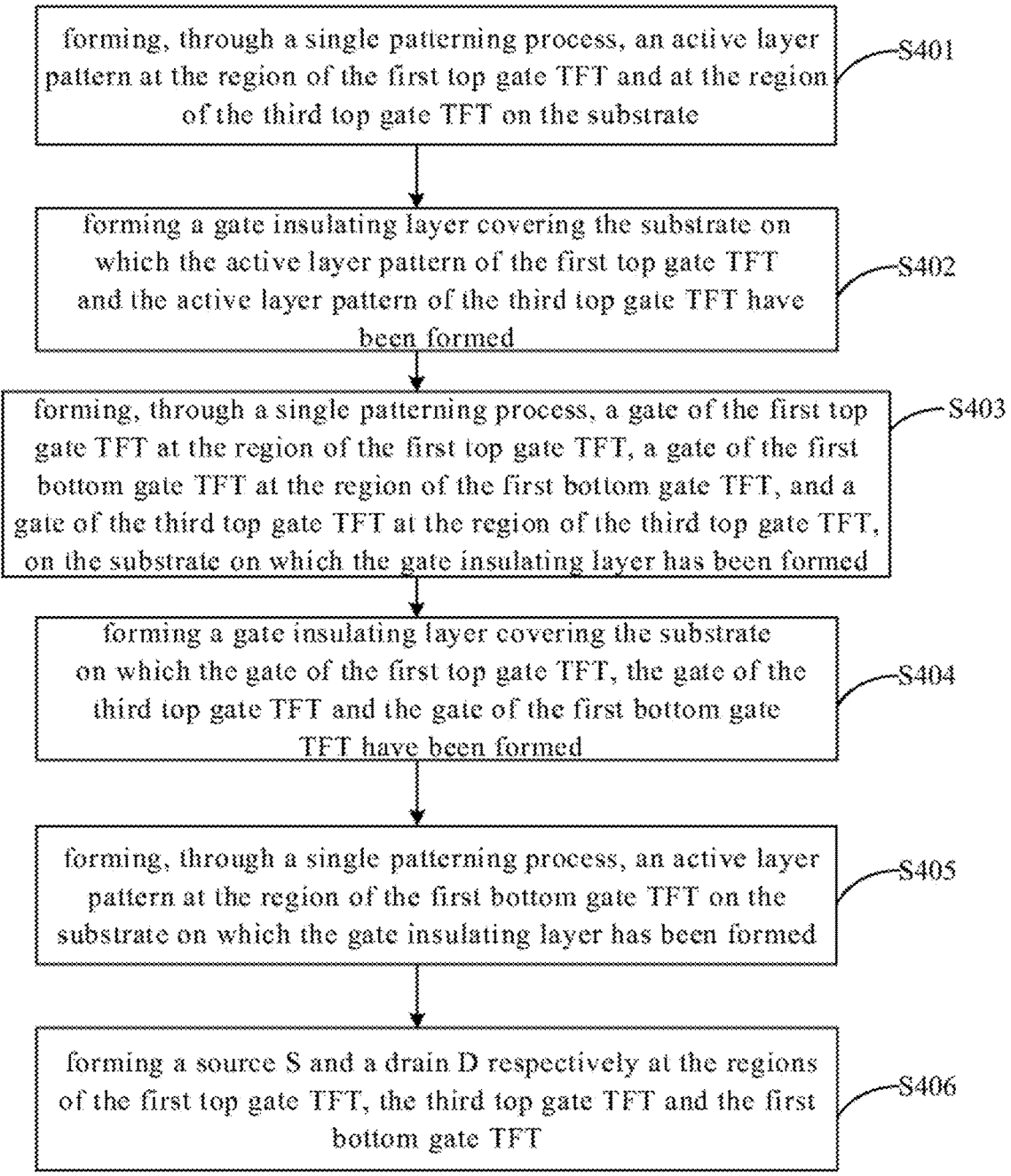
FIG. 17 is a schematic diagram of another manufacturing method of an array substrate provided in the present disclosure.

As shown in FIG. 17, the manufacturing method of the array substrate includes:

S401, as shown in FIGS. 6a and 6b, forming, through a single patterning process, an active layer pattern 20 at the region of the first top gate TFT 110 and at the region of the third top gate TFT 130 on the substrate.

The active layer pattern 20 of the first top gate TFT 110 and the active layer pattern 20 of the third top gate TFT 130 are arranged along the second direction Y and formed in a same layer, the active layer pattern 20 of the first top gate TFT 110 and the active layer pattern 20 of the third top gate TFT 130 both extend in the second direction Y.

S402, as shown in FIGS. 6a and 6b, forming a gate insulating layer 30 covering the substrate on which the active layer pattern 20 of the first top gate TFT 110 and the active layer pattern 20 of the third top gate TFT 130 have been formed.

S403, as shown in FIGS. 6*a* and 6*b*, forming, through a single patterning process, a gate of the first top gate TFT 110 at the region of the first top gate TFT 110, a gate of the first bottom gate TFT 210 at the region of the first bottom gate TFT 210, and a gate of the third top gate TFT 130 at the region of the third top gate TFT 130, on the substrate on which the gate insulating layer 30 has been formed.

S404, as shown in FIGS. 6*a* and 6*b*, forming a gate insulating layer 30 covering the substrate on which the gate of the first top gate TFT 110, the gate of the third top gate TFT 130 and the gate of the first bottom gate TFT 210 have been formed.

S405, as shown in FIGS. 6*a* and 6*b*, forming, through a single patterning process, an active layer pattern 20 at the region of the first bottom gate TFT 210 on the substrate on which the gate insulating layer 30 has been formed.

The active layer pattern 20 of the first top gate TFT 110 and the active layer pattern 20 of the first bottom gate TFT 210 are respectively arranged along the first direction X and disposed on different layers. The active layer pattern 20 of the first bottom gate TFT 210 extends in the second direction Y.

S406, as shown in FIGS. 6*a* and 6*b*, forming a source S and a drain D respectively at the regions of the first top gate TFT 110, the third top gate TFT 130 and the first bottom gate TFT 210.

The manufacturing method of the array substrate provided by the embodiments of the present disclosure has the same beneficial effect as the array substrate 01 described above, and will not be repeated here.

According to some embodiments of the present disclosure, a manufacturing method of an array substrate is provided, the array substrate comprises the first top gate TFT, the first bottom gate TFT, the third top gate TFT and the third bottom gate TFT.

Figure 18:
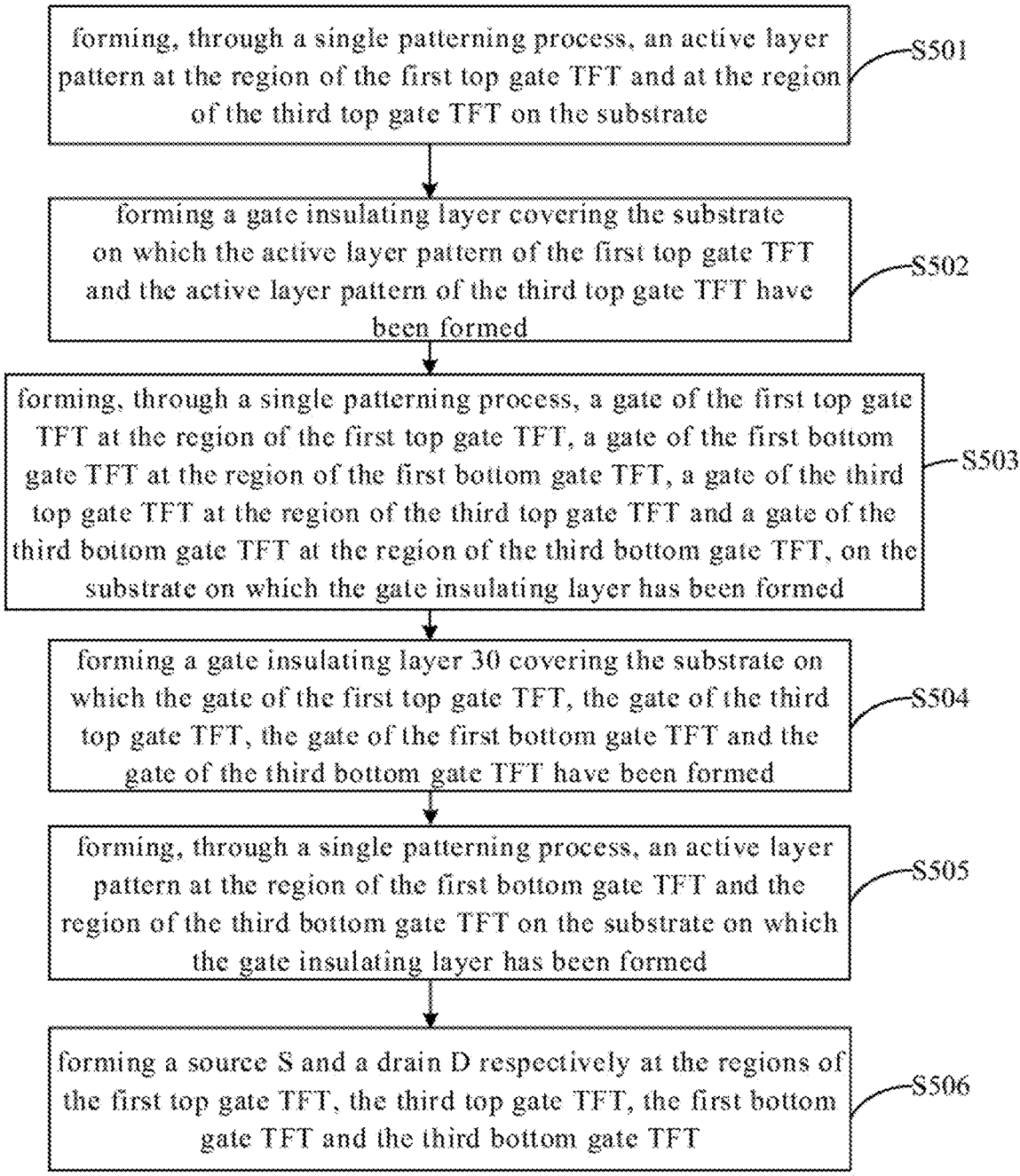
FIG. 18 is a schematic diagram of another manufacturing method of an array substrate provided in the present disclosure.

As shown in FIG. 18, the manufacturing method of the array substrate includes:

S501, as shown in FIGS. 7*a* and 7*b*, forming, through a single patterning process, an active layer pattern 20 at the region of the first top gate TFT 110 and at the region of the third top gate TFT 130 on the substrate.

The active layer pattern 20 of the first top gate TFT 110 and the active layer pattern 20 of the third top gate TFT 130 are arranged along the second direction Y and formed in a same layer, the active layer pattern 20 of the first top gate TFT 110 and the active layer pattern 20 of the third top gate TFT 130 both extend in the second direction Y.

S502, as shown in FIGS. 7*a* and 7*b*, forming a gate insulating layer 30 covering the substrate on which the active layer pattern 20 of the first top gate TFT 110 and the active layer pattern 20 of the third top gate TFT 130 have been formed.

S503, as shown in FIGS. 7*a* and 7*b*, forming, through a single patterning process, a gate of the first top gate TFT 110 at the region of the first top gate TFT 110, a gate of the first bottom gate TFT 210 at the region of the first bottom gate TFT 210, a gate of the third top gate TFT 130 at the region of the third top gate TFT 130 and a gate of the third bottom gate TFT 230 at the region of the third bottom gate TFT 230, on the substrate on which the gate insulating layer 30 has been formed.

S504, as shown in FIGS. 7*a* and 7*b*, forming a gate insulating layer 30 covering the substrate on which the gate of the first top gate TFT 110, the gate of the third top gate TFT 130, the gate of the first bottom gate TFT 210 and the gate of the third bottom gate TFT 230 have been formed.

S505, as shown in FIGS. 7*a* and 7*b*, forming, through a single patterning process, an active layer pattern 20 at the region of the first bottom gate TFT 210 and the region of the third bottom gate TFT 230 on the substrate on which the gate insulating layer 30 has been formed.

The active layer pattern 20 of the first bottom gate TFT 210 and the active layer pattern 20 of the third bottom gate TFT 230 are respectively arranged along the second direction Y and disposed in the same layer. The active layer pattern 20 of the first bottom gate TFT 210 and the active layer pattern 20 of the third bottom gate TFT 230 both extend in the second direction Y.

S506, as shown in FIGS. 7*a* and 7*b*, forming a source S and a drain D respectively at the regions of the first top gate TFT 110, the third top gate TFT 130, the first bottom gate TFT 210 and the third bottom gate TFT 230.

The manufacturing method of the array substrate provided by the embodiments of the present disclosure has the same beneficial effect as the array substrate 01 described above, and will not be repeated here.

According to some embodiments of the present disclosure, a manufacturing method of an array substrate is provided, the array substrate comprises the first top gate TFT, the second top gate TFT, the third top gate TFT and the fifth top gate TFT, the first bottom gate TFT located between the first top gate TFT and the second top gate TFT, and the third bottom gate TFT located between the third top gate TFT and the fifth top gate TFT.

As shown in FIG. 19, the manufacturing method of the array substrate includes:

S601, as shown in FIGS. 8*a* and 8*b*, forming, through a single patterning process, an active layer pattern 20 at the region of the first top gate TFT 110, the region of the second top gate TFT 120, the region of the third top gate TFT 130 and the region of the fifth top gate TFT 150 on the substrate.

The active layer pattern 20 of the first top gate TFT 110 and the active layer pattern 20 of the second top gate TFT 120 are arranged along the first direction X and formed in a same layer, the active layer pattern 20 of the third top gate TFT 130 and the active layer pattern 20 of the fifth top gate TFT 150 are arranged along the first direction X and formed in a same layer, the active layer patterns 20 of the first top gate TFT 110, the second top gate TFT 120, the third top gate TFT 130 and the fifth top gate TFT 150 extend in the second direction Y.

S602, as shown in FIGS. 8*a* and 8*b*, forming a gate insulating layer 30 covering the substrate on which the active layer patterns 20 of the first top gate TFT 110, the second top gate TFT 120, the third top gate TFT 130 and the fifth top gate TFT 150 have been formed.

S603, as shown in FIGS. 8*a* and 8*b*, forming, through a single patterning process, a gate of the first top gate TFT 110 at the region of the first top gate TFT 110, a gate of the first bottom gate TFT 210 at the region of the first bottom gate TFT 210, a gate of the second top gate TFT 120 at the region of the second top gate TFT 120, a gate of the third top gate TFT 130 at the region of the third top gate TFT 130, a gate of the fifth top gate TFT 150 at the region of the fifth top gate TFT 150, and a gate of the third bottom gate TFT 230 at the region of the third bottom gate TFT 230, on the substrate on which the gate insulating layer 30 has been formed.

S604, as shown in FIGS. 8*a* and 8*b*, forming a gate insulating layer 30 covering the substrate on which the gate of the first top gate TFT 110, the gate of the second top gate TFT 120, the gate of the third top gate TFT 130, the gate of the fifth top gate TFT 150, the gate of the first bottom gate TFT 210 and the gate of the third bottom gate TFT 230 have been formed.

S605, as shown in FIGS. 8a and 8b, forming, through a single patterning process, an active layer pattern 20 at the region of the first bottom gate TFT 210 and the region of the third bottom gate TFT 230 on the substrate on which the gate insulating layer 30 has been formed.

The active layer pattern 20 of the first bottom gate TFT 210, the active layer pattern 20 of the first top gate TFT 110 and the active layer pattern 20 of the second top gate TFT 120 are arranged along the first direction X and formed in different layers, the active layer pattern 20 of the third bottom gate TFT 230, the active layer pattern 20 of the third top gate TFT 130 and the active layer pattern 20 of the fifth top gate TFT 150 are arranged along the first direction X and formed in different layers, both the active layer pattern 20 of the first bottom gate TFT 210 and the active layer pattern 20 of the third bottom gate TFT 230 extend in the second direction Y.

S606, as shown in FIGS. 8a and 8b, forming a source S and a drain D respectively at the region of the first top gate TFT 110, the region of the second top gate TFT 120, the region of the third top gate TFT 130 and the region of the fifth top gate TFT 150, the regions of the first bottom gate TFT 210 and the third bottom gate TFT 230.

The manufacturing method of the array substrate provided by the embodiments of the present disclosure has the same beneficial effect as the array substrate 01 described above, and will not be repeated here.

According to some embodiments of the present disclosure, a manufacturing method of an array substrate is provided, the array substrate comprises the first bottom gate TFT, the second bottom gate TFT, the third bottom gate TFT and the fifth bottom gate TFT, the first top gate TFT located between the first bottom gate TFT and the second bottom gate TFT, and the third top gate TFT located between the third bottom gate TFT and the fifth bottom gate TFT.

Figure 20:
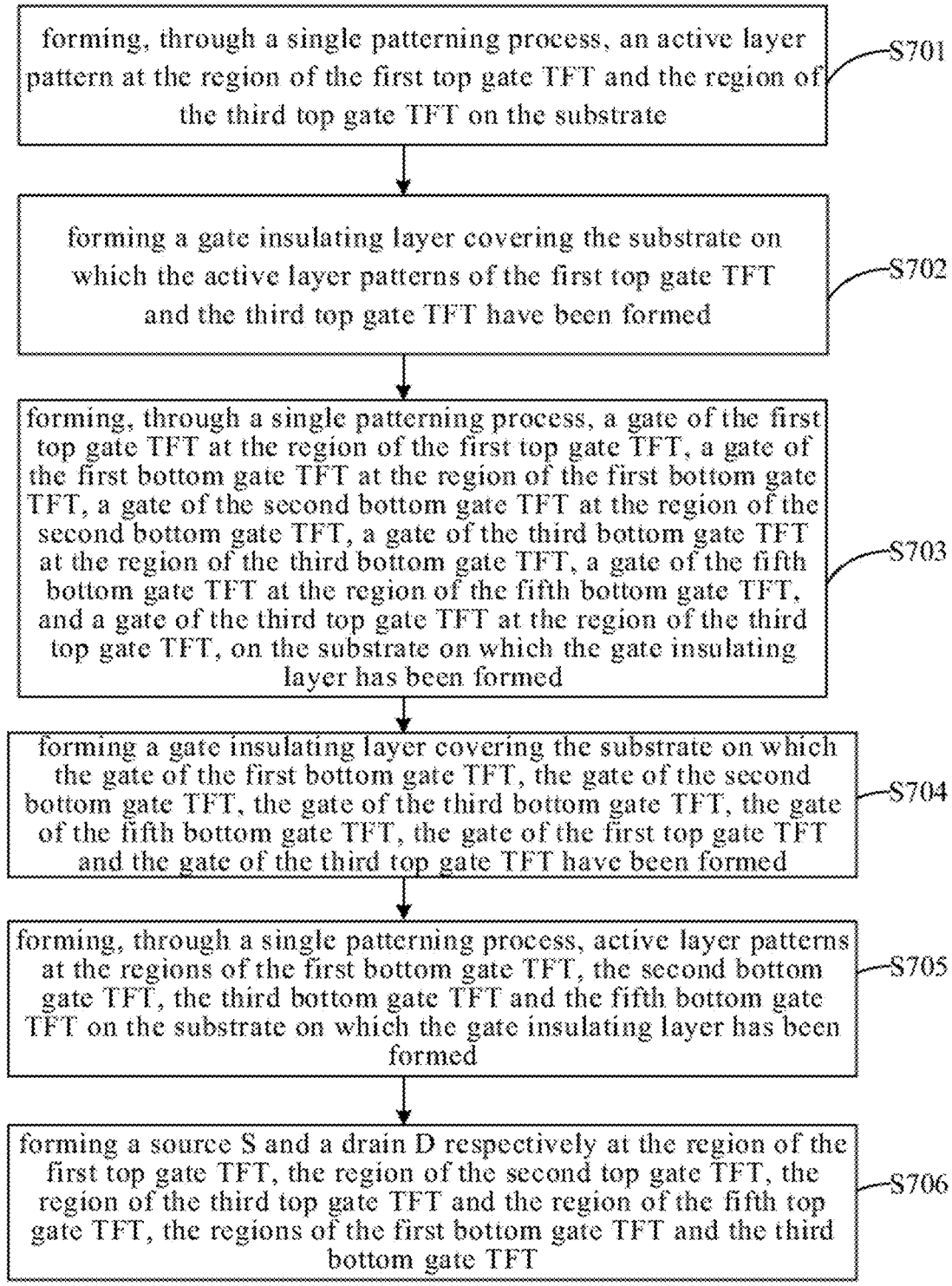
FIG. 20 is a schematic diagram of another manufacturing method of an array substrate provided in the present disclosure.

As shown in FIG. 20, the manufacturing method of the array substrate includes:

S701, as shown in FIGS. 9a and 9b, forming, through a single patterning process, an active layer pattern 20 at the region of the first top gate TFT 110 and the region of the third top gate TFT 130 on the substrate.

The active layer pattern 20 of the first top gate TFT 110 and the active layer pattern 20 of the third top gate TFT 130 are arranged along the second direction Y and formed in a same layer, both the active layer pattern 20 of the first top gate TFT 110 and the active layer pattern 20 of the third top gate TFT 130 extend in the second direction Y.

S702, as shown in FIGS. 9a and 9b, forming a gate insulating layer 30 covering the substrate on which the active layer patterns 20 of the first top gate TFT 110 and the third top gate TFT 130 have been formed.

S703, as shown in FIGS. 9a and 9b, forming, through a single patterning process, a gate of the first top gate TFT 110 at the region of the first top gate TFT 110, a gate of the first bottom gate TFT 210 at the region of the first bottom gate TFT 210, a gate of the second bottom gate TFT 220 at the region of the second bottom gate TFT 220, a gate of the third bottom gate TFT 230 at the region of the third bottom gate TFT 230, a gate of the fifth bottom gate TFT 250 at the region of the fifth bottom gate TFT 250, and a gate of the third top gate TFT 130 at the region of the third top gate TFT 130, on the substrate on which the gate insulating layer 30 has been formed.

S704, as shown in FIGS. 9a and 9b, forming a gate insulating layer 30 covering the substrate on which the gate of the first bottom gate TFT 210, the gate of the second bottom gate TFT 220, the gate of the third bottom gate TFT 230, the gate of the fifth bottom gate TFT 250, the gate of the first top gate TFT 110 and the gate of the third top gate TFT 130 have been formed.

S705, as shown in FIGS. 9a and 9b, forming, through a single patterning process, active layer patterns 20 at the regions of the first bottom gate TFT 210, the second bottom gate TFT 220, the third bottom gate TFT 230 and the fifth bottom gate TFT 250 on the substrate on which the gate insulating layer 30 has been formed.

The active layer pattern 20 of the first bottom gate TFT 210 and the active layer pattern 20 of the second bottom gate TFT 220 are spaced from each other in the first direction (see the arrow X shown in FIGS. 9a and 9b) and formed in the same layer. The active layer pattern 20 of the third bottom gate TFT 230 and the active layer pattern 20 of the fifth bottom gate TFT 250 are arranged along the first direction X and formed in the same layer. The active layer patterns 20 of the first bottom gate TFT 210, the second bottom gate TFT 220, the third bottom gate TFT 230 and the fifth bottom gate TFT 250 extend in the second direction Y.

S706, as shown in FIGS. 9a and 9b, forming a source S and a drain D respectively at the region of the first top gate TFT 110, the region of the second top gate TFT 120, the region of the third top gate TFT 130 and the region of the fifth top gate TFT 150, the regions of the first bottom gate TFT 210 and the third bottom gate TFT 230.

The manufacturing method of the array substrate provided by the embodiments of the present disclosure has the same beneficial effect as the array substrate 01 described above, and will not be repeated here.

According to some embodiments of the present disclosure, a manufacturing method of an array substrate is provided, the array substrate comprises the first top gate TFT, the first bottom gate TFT, the fourth top gate TFT and the fourth bottom gate TFT.

Figure 21:
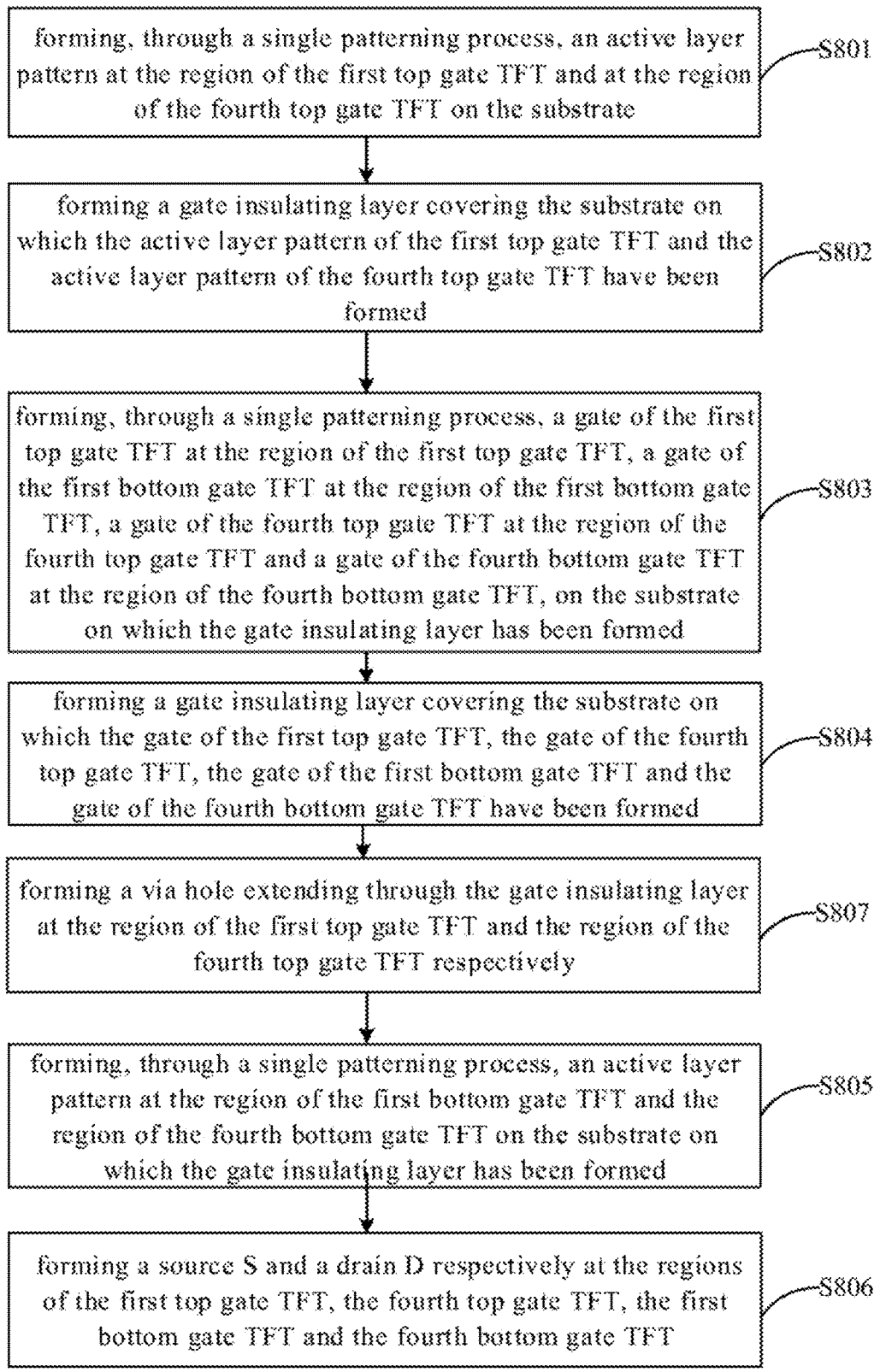
FIG. 21 is a schematic diagram of another manufacturing method of an array substrate provided in the present disclosure.

As shown in FIG. 21, the manufacturing method of the array substrate includes:

S801, as shown in FIGS. 10c and 11c, forming, through a single patterning process, an active layer pattern 20 at the region of the first top gate TFT 110 and at the region of the fourth top gate TFT 140 on the substrate.

The active layer pattern 20 of the first top gate TFT 110 and the active layer pattern 20 of the fourth top gate TFT 140 are formed in a same layer, the active layer pattern 20 of the first top gate TFT 110 and the active layer pattern 20 of the fourth top gate TFT 140 both extend in the second direction Y.

S802, as shown in FIGS. 10c and 11c, forming a gate insulating layer 30 covering the substrate on which the active layer pattern 20 of the first top gate TFT 110 and the active layer pattern 20 of the fourth top gate TFT 140 have been formed.

S803, as shown in FIGS. 10c and 11c, forming, through a single patterning process, a gate of the first top gate TFT 110 at the region of the first top gate TFT 110, a gate of the first bottom gate TFT 210 at the region of the first bottom gate TFT 210, a gate of the fourth top gate TFT 140 at the region of the fourth top gate TFT 140 and a gate of the fourth bottom gate TFT 240 at the region of the fourth bottom gate TFT 240, on the substrate on which the gate insulating layer 30 has been formed.

S804, as shown in FIGS. 10c and 11c, forming a gate insulating layer 30 covering the substrate on which the gate of the first top gate TFT 110, the gate of the fourth top gate TFT 140, the gate of the first bottom gate TFT 210 and the gate of the fourth bottom gate TFT 240 have been formed.

S805, as shown in FIGS. 10c and 11c, forming, through a single patterning process, an active layer pattern 20 at the region of the first bottom gate TFT 210 and the region of the fourth bottom gate TFT 240 on the substrate on which the gate insulating layer 30 has been formed.

The active layer pattern 20 of the first top gate TFT 110 and the active layer pattern 20 of the first bottom gate TFT 210 are respectively arranged along the first direction X and disposed in different layers. The active layer pattern 20 of the fourth top gate TFT 140 and the active layer pattern 20 of the fourth bottom gate TFT 240 are respectively arranged along the first direction X and disposed in different layers. The active layer pattern 20 of the first top gate TFT 110, the first bottom gate TFT 210, the fourth top gate TFT 140 and the active layer pattern 20 of the fourth bottom gate TFT 240 both extend in the second direction Y.

S806, as shown in FIGS. 10c and 11c, forming a source S and a drain D respectively at the regions of the first top gate TFT 110, the fourth top gate TFT 140, the first bottom gate TFT 210 and the fourth bottom gate TFT 240.

Moreover, the manufacturing method of the array substrate further includes a step S807 between the above steps S804 and S805:

S807, as shown in FIGS. 10a, 10b, 11a and 11b, a via hole 50 extending through the gate insulating layer 30 is formed at the region of the first top gate TFT 110 and the region of the fourth top gate TFT 140 respectively.

The first top gate TFT 110 is connected with the fourth bottom gate TFT 240 through the via hole, and the fourth top gate TFT 140 is connected with the first bottom gate TFT 210 through the via hole.

The manufacturing method of the array substrate provided by the embodiments of the present disclosure has the same beneficial effect as the array substrate 01 described above, and will not be repeated here.

According to some embodiments of the present disclosure, a manufacturing method of an array substrate is provided, the array substrate comprises the first top gate TFT, the second top gate TFT, the fourth bottom gate TFT and the sixth bottom gate TFT, the first bottom gate TFT located between the first top gate TFT and the second top gate TFT, and the fourth top gate TFT located between the fourth bottom gate TFT and the sixth bottom gate TFT.

Figure 22:
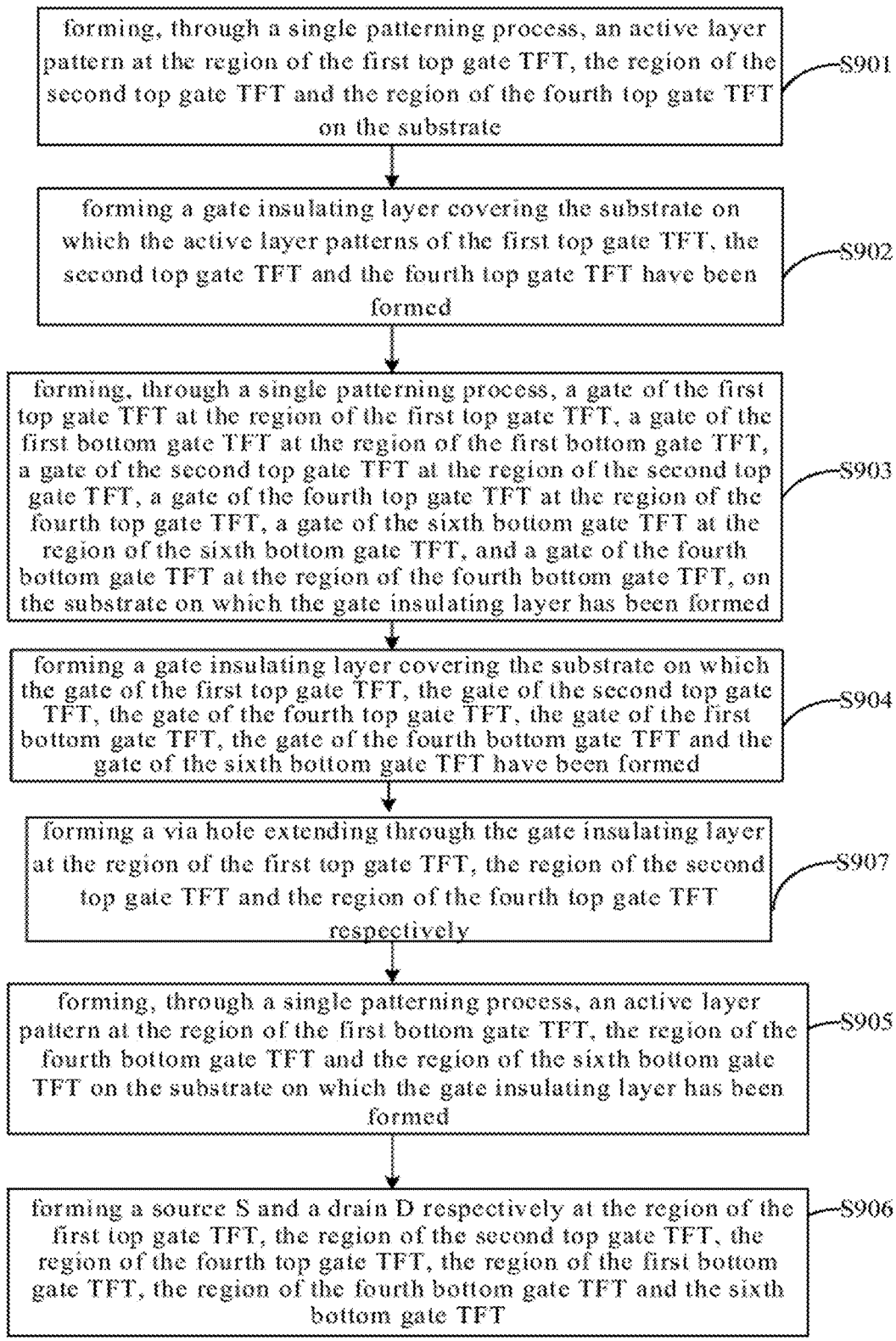
FIG. 22 is a schematic diagram of another manufacturing method of an array substrate provided in the present disclosure.

As shown in FIG. 22, the manufacturing method of the array substrate includes:

S901, as shown in FIG. 12b, forming, through a single patterning process, an active layer pattern 20 at the region of the first top gate TFT 110, the region of the second top gate TFT 120 and the region of the fourth top gate TFT 140 on the substrate.

The active layer pattern 20 of the first top gate TFT 110 and the active layer pattern 20 of the second top gate TFT 120 are arranged along the first direction X and formed in a same layer, the active layer patterns 20 of the first top gate TFT 110, the second top gate TFT 120 and the fourth top gate TFT 140 extend in the second direction Y.

S902, as shown in FIG. 12b, forming a gate insulating layer 30 covering the substrate on which the active layer patterns 20 of the first top gate TFT 110, the second top gate TFT 120 and the fourth top gate TFT 140 have been formed.

S903, as shown in FIG. 12b, forming, through a single patterning process, a gate of the first top gate TFT 110 at the region of the first top gate TFT 110, a gate of the first bottom gate TFT 210 at the region of the first bottom gate TFT 210, a gate of the second top gate TFT 120 at the region of the second top gate TFT 120, a gate of the fourth top gate TFT 140 at the region of the fourth top gate TFT 140, a gate of the sixth bottom gate TFT 260 at the region of the sixth bottom gate TFT 260, and a gate of the fourth bottom gate TFT 240 at the region of the fourth bottom gate TFT 240, on the substrate on which the gate insulating layer 30 has been formed.

S904, as shown in FIG. 12b, forming a gate insulating layer 30 covering the substrate on which the gate of the first top gate TFT 110, the gate of the second top gate TFT 120, the gate of the fourth top gate TFT 140, the gate of the first bottom gate TFT 210, the gate of the fourth bottom gate TFT 240 and the gate of the sixth bottom gate TFT 260 have been formed.

S905, as shown in FIG. 12b, forming, through a single patterning process, an active layer pattern 20 at the region of the first bottom gate TFT 210, the region of the fourth bottom gate TFT 240 and the region of the sixth bottom gate TFT 260 on the substrate on which the gate insulating layer 30 has been formed.

The active layer pattern 20 of the first bottom gate TFT 210, the active layer pattern 20 of the first top gate TFT 110 and the active layer pattern 20 of the second top gate TFT 120 are arranged along the first direction X and formed in different layers; the active layer pattern 20 of the fourth bottom gate TFT 240, the active layer pattern 20 of the fourth top gate TFT 140 and the active layer pattern 20 of the sixth bottom gate TFT 260 are arranged along the first direction X and formed in different layers; the active layer pattern 20 of the first bottom gate TFT 210, the active layer pattern 20 of the fourth bottom gate TFT 240 and the active layer pattern 20 of the sixth bottom gate TFT 260 extend in the second direction Y.

S906, as shown in FIG. 12b, forming a source S and a drain D respectively at the region of the first top gate TFT 110, the region of the second top gate TFT 120, the region of the fourth top gate TFT 140, the region of the first bottom gate TFT 210, the region of the fourth bottom gate TFT 240 and the sixth bottom gate TFT 260.

Moreover, the manufacturing method of the array substrate further includes a step S907 between the above steps S904 and S905:

S907, as shown in FIG. 12a, a via hole 50 extending through the gate insulating layer 30 is formed at the region of the first top gate TFT 110, the region of the second top gate TFT 120 and the region of the fourth top gate TFT 140 respectively.

The first top gate TFT 110 is connected with the fourth bottom gate TFT 240 through the via hole, the fourth top gate TFT 140 is connected with the first bottom gate TFT 210 through the via hole, and the second top gate TFT 120 is connected with the sixth bottom gate TFT 260 through the via hole.

The manufacturing method of the array substrate provided by the embodiments of the present disclosure has the same beneficial effect as the array substrate 01 described above, and will not be repeated here.

According to some embodiments of the present disclosure, a manufacturing method of an array substrate is provided, the array substrate comprises the first bottom gate TFT, the second bottom gate TFT, the fourth top gate TFT and the sixth top gate TFT, the first top gate TFT located between the first bottom gate TFT and the second bottom gate TFT, and the fourth bottom gate TFT located between the fourth top gate TFT and the sixth top gate TFT.

Figure 23:
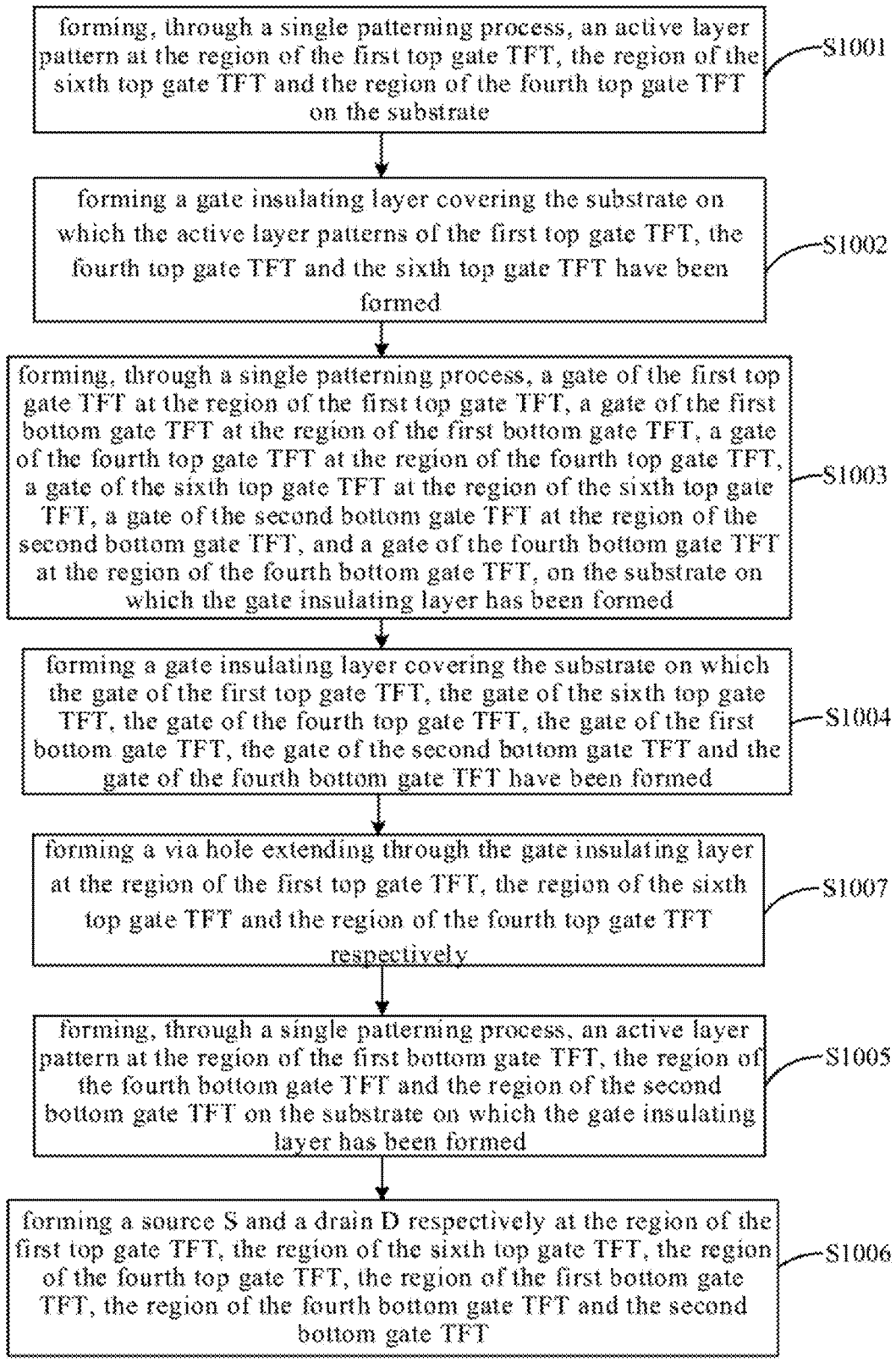
FIG. 23 is a schematic diagram of another manufacturing method of an array substrate provided in the present disclosure.

As shown in FIG. 23, the manufacturing method of the array substrate includes:

S1001, as shown in FIG. 13b, forming, through a single patterning process, an active layer pattern 20 at the region of the first top gate TFT 110, the region of the sixth top gate TFT 160 and the region of the fourth top gate TFT 140 on the substrate.

The active layer pattern 20 of the fourth top gate TFT 110 and the active layer pattern 20 of the sixth top gate TFT 160 are arranged along the first direction X and formed in a same layer, the active layer patterns 20 of the first top gate TFT 110, the sixth top gate TFT 160 and the fourth top gate TFT 140 extend in the second direction Y.

S1002, as shown in FIG. 13b, forming a gate insulating layer 30 covering the substrate on which the active layer patterns 20 of the first top gate TFT 110, the fourth top gate TFT 140 and the sixth top gate TFT 160 have been formed.

S1003, as shown in FIG. 13b, forming, through a single patterning process, a gate of the first top gate TFT 110 at the region of the first top gate TFT 110, a gate of the first bottom gate TFT 210 at the region of the first bottom gate TFT 210, a gate of the fourth top gate TFT 140 at the region of the fourth top gate TFT 140, a gate of the sixth top gate TFT 160 at the region of the sixth top gate TFT 160, a gate of the second bottom gate TFT 220 at the region of the second bottom gate TFT 220, and a gate of the fourth bottom gate TFT 240 at the region of the fourth bottom gate TFT 240, on the substrate on which the gate insulating layer 30 has been formed.

S1004, as shown in FIG. 13b, forming a gate insulating layer 30 covering the substrate on which the gate of the first top gate TFT 110, the gate of the sixth top gate TFT 160, the gate of the fourth top gate TFT 140, the gate of the first bottom gate TFT 210, the gate of the second bottom gate TFT 220 and the gate of the fourth bottom gate TFT 240 have been formed.

S1005, as shown in FIG. 13b, forming, through a single patterning process, an active layer pattern 20 at the region of the first bottom gate TFT 210, the region of the fourth bottom gate TFT 240 and the region of the second bottom gate TFT 220 on the substrate on which the gate insulating layer 30 has been formed.

The active layer pattern 20 of the first bottom gate TFT 210, the active layer pattern 20 of the first top gate TFT 110 and the active layer pattern 20 of the second bottom gate TFT 220 are arranged along the first direction X and formed in different layers; the active layer pattern 20 of the fourth bottom gate TFT 240, the active layer pattern 20 of the fourth top gate TFT 140 and the active layer pattern 20 of the sixth top gate TFT 160 are arranged along the first direction X and formed in different layers; the active layer pattern 20 of the first bottom gate TFT 210, the active layer pattern 20 of the fourth bottom gate TFT 240 and the active layer pattern 20 of the fourth bottom gate TFT 240 extend in the second direction Y.

S1006, as shown in FIG. 13b, forming a source S and a drain D respectively at the region of the first top gate TFT 110, the region of the sixth top gate TFT 160, the region of the fourth top gate TFT 140, the region of the first bottom gate TFT 210, the region of the fourth bottom gate TFT 240 and the second bottom gate TFT 220.

Moreover, the manufacturing method of the array substrate further includes a step S1007 between the above steps S1004 and S1005:

S1007, as shown in FIG. 13a, a via hole 50 extending through the gate insulating layer 30 is formed at the region of the first top gate TFT 110, the region of the sixth top gate TFT 160 and the region of the fourth top gate TFT 140 respectively.

The first top gate TFT 110 is connected with the fourth bottom gate TFT 240 through the via hole, the fourth top gate TFT 140 is connected with the first bottom gate TFT 210 through the via hole, and the second bottom gate TFT 220 is connected with the sixth top gate TFT 160 through the via hole.

The manufacturing method of the array substrate provided by the embodiments of the present disclosure has the same beneficial effect as the array substrate 01 described above, and will not be repeated here.

According to some embodiments of the present disclosure, a display panel including the above array substrate 01 is also provided. The display panel has the same beneficial effect as the array substrate 01 described above, and will not be repeated here.

It should be understood that, the above embodiments are merely the exemplary embodiments for illustrating a principle of the present disclosure, but the present disclosure is not limited thereto. Those skilled in the art may make various modifications and improvements without departing from the spirit and essence of the present disclosure, and these modifications and improvements also fall into the scope of the present disclosure.

What is claimed is:

1. An array substrate, comprising a substrate, at least one top gate TFT and at least one bottom gate TFT disposed on the substrate and located in each sub-pixel region;

the at least one top gate TFT comprises a first top gate TFT, the at least one bottom gate TFT comprises a first bottom gate TFT, a gate of the first top gate TFT and a gate of the first bottom gate TFT are formed in a same layer with same material, an active layer pattern of the first top gate TFT and an active layer pattern of the first bottom gate TFT are respectively arranged on two sides of the gate, and orthographic projections of the active layer pattern of the first top gate TFT and the active layer pattern of the first bottom gate TFT on the substrate are spaced from each other in a first direction;

wherein both the active layer pattern of the at least one top gate TFT and the active layer pattern of the at least one bottom gate TFT extend in a second direction, the first direction and the second direction cross each other;

wherein the at least one top gate TFT further includes a second top gate TFT;

the active layer pattern of the first top gate TFT and the active layer pattern of the second top gate TFT are formed in a same layer with same material, the gate of the first top gate TFT, the gate of the first bottom gate TFT and the gate of the second top gate TFT are formed in a same layer with same material; and orthographic projections of the active layer pattern of the first top gate TFT, the active layer pattern of the first bottom gate TFT and the active layer pattern of the second top gate TFT on the substrate are spaced from each other in the first direction.

2. The array substrate according to claim 1, further comprising a first gate line, the gate of the first top gate TFT, the gate of the first bottom gate TFT and the gate of the second top gate TFT are respectively part of the first gate line.

3. The array substrate according to claim 1, wherein the at least one top gate TFT further includes a third top gate TFT, the active layer pattern of the first top gate TFT and the active layer pattern of the third top gate TFT are formed in a same layer and connected with each other, and the active layer pattern of the third top gate TFT extends in the second direction.

4. The array substrate according to claim 1, wherein the at least one bottom gate TFT further includes a fourth bottom gate TFT, the active layer pattern of the first top gate TFT and the active layer pattern of the fourth bottom gate TFT are formed in different layers, and the active layer pattern of the fourth bottom gate TFT extends in the second direction.

5. The array substrate according to claim 4, wherein the at least one top gate TFT further includes a fourth top gate TFT, the active layer pattern of the first bottom gate TFT and the active layer pattern of the fourth top gate TFT are formed in different layers, and the active layer pattern of the fourth top gate TFT extends in the second direction.

6. The array substrate according to claim 5, wherein the at least one bottom gate TFT further includes a sixth bottom gate TFT, the active layer pattern of the second top gate TFT and the active layer pattern of the sixth bottom gate TFT are formed in different layers, and the active layer pattern of the sixth bottom gate TFT extends in the second direction.

7. The array substrate according to claim 5, wherein the at least one top gate TFT further includes a sixth top gate TFT, the active layer pattern of the second bottom gate TFT and the active layer pattern of the sixth top gate TFT are formed in different layers, and the active layer pattern of the sixth top gate TFT extends in the second direction.

8. The array substrate according to claim 6, further comprising a second gate line, the gate of the fourth bottom gate TFT, the gate of the fourth top gate TFT and the gate of the sixth bottom gate TFT are respectively part of the second gate line.

9. The array substrate according to claim 7, further comprising a second gate line, the gate of the fourth bottom gate TFT, the gate of the fourth top gate TFT and the gate of the sixth top gate TFT are respectively part of the second gate line.

10. A display panel comprising the array substrate according to claim 1.

11. An array substrate, comprising a substrate, at least one top gate TFT and at least one bottom gate TFT disposed on the substrate and located in each sub-pixel region;
the at least one top gate TFT comprises a first top gate TFT, the at least one bottom gate TFT comprises a first bottom gate TFT, a gate of the first top gate TFT and a gate of the first bottom gate TFT are formed in a same layer with same material, an active layer pattern of the first top gate TFT and an active layer pattern of the first bottom gate TFT are respectively arranged on two sides of the gate, and orthographic projections of the active layer pattern of the first top gate TFT and the active layer pattern of the first bottom gate TFT on the substrate are spaced from each other in a first direction;

wherein both the active layer pattern of the at least one top gate TFT and the active layer pattern of the at least one bottom gate TFT extend in a second direction, the first direction and the second direction cross each other;
wherein the at least one bottom gate TFT further includes a second bottom gate TFT;
the active layer pattern of the first bottom gate TFT and the active layer pattern of the second bottom gate TFT are formed in a same layer with same material, the gate of the first bottom gate TFT, the gate of the first top gate TFT and the gate of the second bottom gate TFT are formed in a same layer with same material; and
orthographic projections of the active layer pattern of the first bottom gate TFT, the active layer pattern of the first top gate TFT and the active layer pattern of the second bottom gate TFT on the substrate are spaced from each other in the first direction.

12. The array substrate according to claim 11, further comprising a first gate line, the gate of the first bottom gate TFT, the gate of the first top gate TFT and the gate of the second bottom gate TFT are respectively part of the first gate line.

13. The array substrate according to claim 11, wherein the at least one bottom gate TFT further includes a third bottom gate TFT, the active layer pattern of the first bottom gate TFT and the active layer pattern of the third bottom gate TFT are formed in a same layer and connected with each other, and the active layer pattern of the third bottom gate TFT extends in the second direction.

14. The array substrate according to claim 13, wherein the at least one top gate TFT further includes a fifth top gate TFT, the active layer pattern of the second top gate TFT and the active layer pattern of the fifth top gate TFT are formed in a same layer and connected with each other, and the active layer pattern of the fifth top gate TFT extends in the second direction.

15. The array substrate according to claim 13, wherein the at least one bottom gate TFT further includes a fifth bottom gate TFT, the active layer pattern of the second bottom gate TFT and the active layer pattern of the fifth bottom gate TFT are formed in a same layer and connected with each other, and the active layer pattern of the fifth bottom gate TFT extends in the second direction.

16. The array substrate according to claim 14, further comprising a second gate line, the gate of the third top gate TFT, the gate of the third bottom gate TFT and the gate of the fifth top gate TFT are respectively part of the second gate line.

17. The array substrate according to claim 14, further comprising a second gate line, the gate of the third top gate TFT, the gate of the third bottom gate TFT and the gate of the fifth bottom gate TFT are respectively part of the second gate line.

* * * * *